US012610854B2

(12) United States Patent
Liang et al.

(10) Patent No.: US 12,610,854 B2
(45) Date of Patent: Apr. 21, 2026

(54) SEMICONDUCTOR DEVICE STRUCTURE WITH BONDING PAD AND METHOD FOR FORMING THE SAME

(71) Applicant: TAIWAN SEMICONDUCTOR MANUFACTURING COMPANY, LTD., Hsinchu (TW)

(72) Inventors: Shih-Wei Liang, Taichung City (TW); Nien-Fang Wu, Chiayi City (TW); Jiun-Yi Wu, Taoyuan City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 591 days.

(21) Appl. No.: 18/150,574

(22) Filed: Jan. 5, 2023

(65) Prior Publication Data

US 2024/0170350 A1 May 23, 2024

Related U.S. Application Data

(60) Provisional application No. 63/427,196, filed on Nov. 22, 2022.

(51) Int. Cl.
H01L 23/10 (2006.01)
H01L 21/48 (2006.01)
(Continued)

(52) U.S. Cl.
CPC .......... H01L 23/10 (2013.01); H01L 21/4817 (2013.01); H01L 24/03 (2013.01);
(Continued)

(58) Field of Classification Search
None
See application file for complete search history.

(56) References Cited

U.S. PATENT DOCUMENTS 8,227,902 B2 * 7/2012 Kuo ...................... H01L 23/552
257/659
8,987,923 B2 * 3/2015 Chou .................... H01L 23/585
438/618
(Continued)

FOREIGN PATENT DOCUMENTS

CN 115527990 A * 12/2022 ......... H01L 21/4857
EP 3331008 A1 * 6/2018 ........... H01L 23/585
(Continued)

*Primary Examiner* — Michael Lebentritt
(74) *Attorney, Agent, or Firm* — Birch, Stewart, Kolasch & Birch, LLP

(57) ABSTRACT

A semiconductor device structure is provided. The semiconductor device structure includes a substrate having a device region and a seal ring region surrounding the device region. The semiconductor device structure includes a seal ring structure over the seal ring region. The seal ring structure surrounds the device region. The semiconductor device structure includes a bonding film over the seal ring structure and the substrate. The semiconductor device structure includes a bonding pad embedded in the bonding film. The bonding pad overlaps the seal ring structure along an axis perpendicular to a first top surface of the substrate, and a second top surface of the bonding pad is substantially level with a third top surface of the bonding film.

20 Claims, 24 Drawing Sheets

(51) Int. Cl.

| | |
|---|---|
| *H01L 23/00* | (2006.01) |
| *H01L 25/065* | (2023.01) |

(52) U.S. Cl.
CPC .............. *H01L 24/08* (2013.01); *H01L 24/09* (2013.01); *H01L 24/80* (2013.01); *H01L 24/94* (2013.01); *H01L 25/0657* (2013.01); *H01L 2224/03616* (2013.01); *H01L 2224/0801* (2013.01); *H01L 2224/08059* (2013.01); *H01L 2224/08145* (2013.01); *H01L 2224/0903* (2013.01); *H01L 2224/09051* (2013.01); *H01L 2224/09517* (2013.01); *H01L 2224/80895* (2013.01); *H01L 2224/80896* (2013.01); *H01L 2224/94* (2013.01); *H01L 2225/06524* (2013.01); *H01L 2225/06527* (2013.01); *H01L 2924/3512* (2013.01)

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 9,780,046 | B2 * | 10/2017 | Pan ....................... H01L 23/564 |
| 2008/0230873 | A1 * | 9/2008 | Demircan ............. H01L 23/585 |
| | | | 257/620 |
| 2012/0038020 | A1 * | 2/2012 | Lin ................... H01L 21/30604 |
| | | | 257/E21.59 |
| 2016/0126324 | A1 * | 5/2016 | Yu ....................... H01L 23/5223 |
| | | | 257/503 |
| 2019/0164914 | A1 * | 5/2019 | Hu .......................... H01L 24/94 |
| 2021/0335722 | A1 * | 10/2021 | Chen ..................... H01L 23/562 |
| 2021/0358821 | A1 * | 11/2021 | Chen ................. H01L 23/5386 |
| 2024/0387304 | A1 * | 11/2024 | Hsin ................... H10D 84/038 |

FOREIGN PATENT DOCUMENTS

| | | | | | |
|---|---|---|---|---|---|
| JP | 5326282 | B2 | * | 10/2013 | |
| JP | 2015038932 | A | * | 2/2015 | |
| JP | 2015088576 | A | * | 5/2015 | ............ H01L 22/32 |
| KR | 20120015988 | A | * | 2/2012 | ........... H10F 39/811 |
| KR | 20120016001 | A | * | 2/2012 | ............ H01L 21/78 |
| TW | 202207388 | A | * | 2/2022 | ........... H01L 23/562 |
| TW | 202221885 | A | * | 6/2022 | ............ H01L 25/50 |
| TW | 1783830 | B | * | 11/2022 | |

* cited by examiner

SEMICONDUCTOR DEVICE STRUCTURE WITH BONDING PAD AND METHOD FOR FORMING THE SAME

PRIORITY CLAIM AND CROSS-REFERENCE

This application claims the benefit of U.S. Provisional Application No. 63/427,196, filed on Nov. 22, 2022, and entitled "SEMICONDUCTOR DEVICE STRUCTURE WITH BONDING PAD AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a top view of the semiconductor device structure of FIG. 1A, in accordance with some embodiments.

FIG. 1H-1 is a top view of the semiconductor device structure of FIG. 1H, in accordance with some embodiments.

DETAILED DESCRIPTION

Figure 1A:
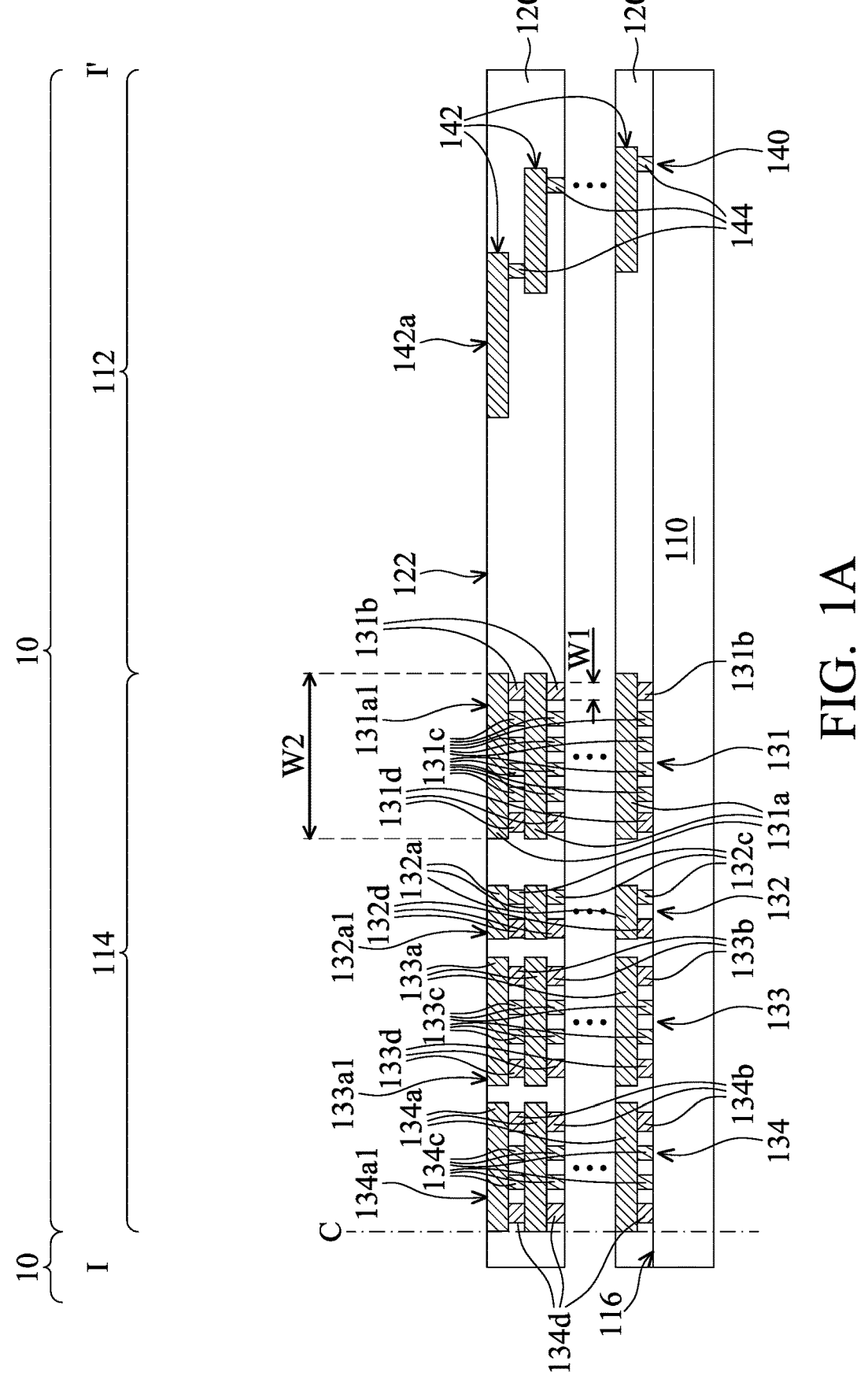
FIGS. 1A-1H are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figures 1, 1A:
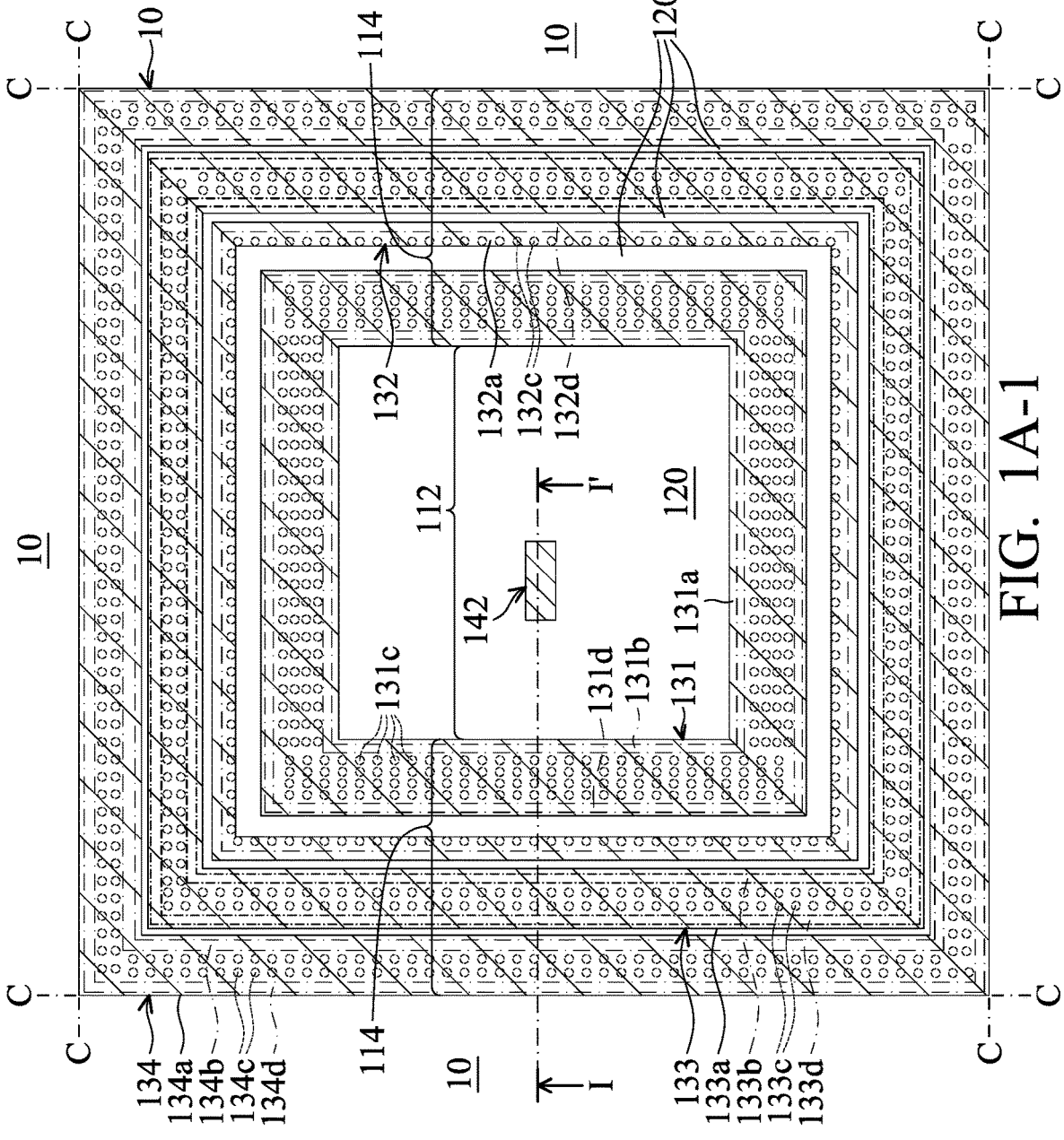

FIGS. 1A-1H are cross-sectional views of various stages of a process for forming a semiconductor device structure, in accordance with some embodiments. FIG. 1A-1 is a top view of the semiconductor device structure of FIG. 1A, in accordance with some embodiments. FIG. 1A is a cross-sectional view illustrating the semiconductor device structure along a sectional line I-I' in FIG. 1A-1, in accordance with some embodiments.

As shown in FIGS. 1A and 1A-1, a substrate 110 is provided, in accordance with some embodiments. As shown in FIGS. 1A and 1A-1, a number of chip areas 10 divided by scribe lines C are defined in the substrate 110, in accordance with some embodiments. In each chip area 10, the substrate 110 has a device region 112 and a seal ring region 114 surrounding the device region 112, in accordance with some embodiments.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a dielectric structure 120, seal ring structures 131, 132, 133, and 134, and a wiring structure 140 are formed over a top surface 116 of the substrate 110, in accordance with some embodiments. The seal ring structures 131, 132, 133, and 134 and the wiring structure 140 are formed in the dielectric structure 120, in accordance with some embodiments.

The seal ring structures 131, 132, 133, and 134 are used to prevent cracks induced by a subsequent dicing process from propagating into the device region 112, in accordance with some embodiments. The seal ring structures 131, 132, 133, and 134 are used to prevent the moisture from diffusing into the device region 112, in accordance with some embodiments.

The seal ring structures 131, 132, 133, and 134 are formed over the seal ring region 114, in accordance with some embodiments. The seal ring structures 131, 132, 133, and 134 surround the device region 112, in accordance with some embodiments. The seal ring structure 131 includes ring strip structures 131a, ring wall structures 131b, pillars 131c, and ring wall structures 131d, in accordance with some embodiments.

The ring strip structures 131a are stacked over the substrate 110, in accordance with some embodiments. The ring wall structures 131b, the pillars 131c, and the ring wall structures 131d are connected between the substrate 110 and the lowermost ring strip structure 131a and between the ring strip structures 131a, in accordance with some embodiments.

The ring wall structure 131b is closer to the device region 112 than the ring wall structure 131d, in accordance with some embodiments. The ring wall structures 131b and 131d continuously surround the entire device region 112, in accordance with some embodiments. In some embodiments, a line width W1 of the ring wall structure 131b is less than a line width W2 of the ring strip structure 131a.

The pillars 131c are between the corresponding ring wall structures 131b and 131d, in accordance with some embodiments. The pillar 131c is narrower than the ring wall structure 131b, in accordance with some embodiments. The pillar 131c is narrower than the ring wall structure 131d, in accordance with some embodiments.

The seal ring structure 132 includes ring strip structures 132a, pillars 132c, and ring wall structures 132d, in accordance with some embodiments. The ring strip structures 132a are stacked over the substrate 110, in accordance with some embodiments. The pillars 132c and the ring wall structures 132d are connected between the substrate 110 and the lowermost ring strip structure 132a and between the ring strip structures 132a, in accordance with some embodiments.

The pillars 132c are closer to the device region 112 than the ring wall structure 132d, in accordance with some embodiments. The ring wall structure 132d continuously surrounds the entire device region 112 and the seal ring structure 131, in accordance with some embodiments. The pillars 132c are adjacent to the corresponding ring wall structure 132d, in accordance with some embodiments. The pillar 132c is narrower than the ring wall structure 132d, in accordance with some embodiments.

The seal ring structure 133 includes ring strip structures 133a, ring wall structures 133b, pillars 133c, and ring wall structures 133d, in accordance with some embodiments. The ring strip structures 133a are stacked over the substrate 110, in accordance with some embodiments. The ring wall structures 133b, the pillars 133c, and the ring wall structures 133d are connected between the substrate 110 and the lowermost ring strip structure 133a and between the ring strip structures 133a, in accordance with some embodiments.

The ring wall structure 133b is closer to the device region 112 than the ring wall structure 133d, in accordance with some embodiments. The ring wall structures 133b and 133d continuously surround the entire device region 112 and the seal ring structures 131 and 132, in accordance with some embodiments.

The pillars 133c are between the corresponding ring wall structures 133b and 133d, in accordance with some embodiments. The pillar 133c is narrower than the ring wall structure 133b, in accordance with some embodiments. The pillar 133c is narrower than the ring wall structure 133d, in accordance with some embodiments.

The seal ring structure 134 includes ring strip structures 134a, ring wall structures 134b, pillars 134c, and ring wall structures 134d, in accordance with some embodiments. The ring strip structures 134a are stacked over the substrate 110, in accordance with some embodiments. The ring wall structures 134b, the pillars 134c, and the ring wall structures 134d are connected between the substrate 110 and the lowermost ring strip structure 134a and between the ring strip structures 134a, in accordance with some embodiments.

The ring wall structure 134b is closer to the device region 112 than the ring wall structure 134d, in accordance with some embodiments. The ring wall structures 134b and 134d continuously surround the entire device region 112 and the seal ring structures 131, 132 and 133, in accordance with some embodiments.

The pillars 134c are between the corresponding ring wall structures 134b and 134d, in accordance with some embodiments. The pillar 134c is narrower than the ring wall structure 134b, in accordance with some embodiments. The pillar 134c is narrower than the ring wall structure 134d, in accordance with some embodiments.

The wiring structure 140 includes wiring layers 142 and conductive via structures 144, in accordance with some embodiments. The wiring layers 142 are stacked over the substrate 110, in accordance with some embodiments. The conductive via structures 144 are connected between the devices (not shown) formed in/on the substrate 110 and the lowermost wiring layer 142 and between the wiring layers 142, in accordance with some embodiments.

In some embodiments, top surfaces 131a1, 132a1, 133a1, 134a1 and 142a of the topmost ring strip structures 131a, 132a, 133a, and 134a and the topmost wiring layer 142 are substantially level with a top surface 122 of the dielectric structure 120.

The dielectric structure 120 is a multi-layer structure, in accordance with some embodiments. The dielectric structure 120 includes dielectric layers stacked with each other (not shown), in accordance with some embodiments.

The dielectric structure 120 is made of any suitable dielectric material, such as silicon oxide, silicon oxynitride, borosilicate glass (BSG), phosphoric silicate glass (PSG), borophosphosilicate glass (BPSG), fluorinated silicate glass (FSG), hydrogenated silicon oxycarbide (SiCO:H), low-k material, porous dielectric material, or a combination thereof, in accordance with some embodiments.

The dielectric structure 120 is formed by any suitable process, such as a chemical vapor deposition (CVD) process, a spin-on process, a sputtering process, or a combination thereof, in accordance with some embodiments.

The seal ring structures 131, 132, 133, and 134 are made of any suitable conductive material, such as copper, a copper alloy, silver, gold, aluminum, or a combination thereof. The wiring structure 140 is made of any suitable conductive material, such as copper, a copper alloy, silver, gold, aluminum, or a combination thereof.

Figure 1B:
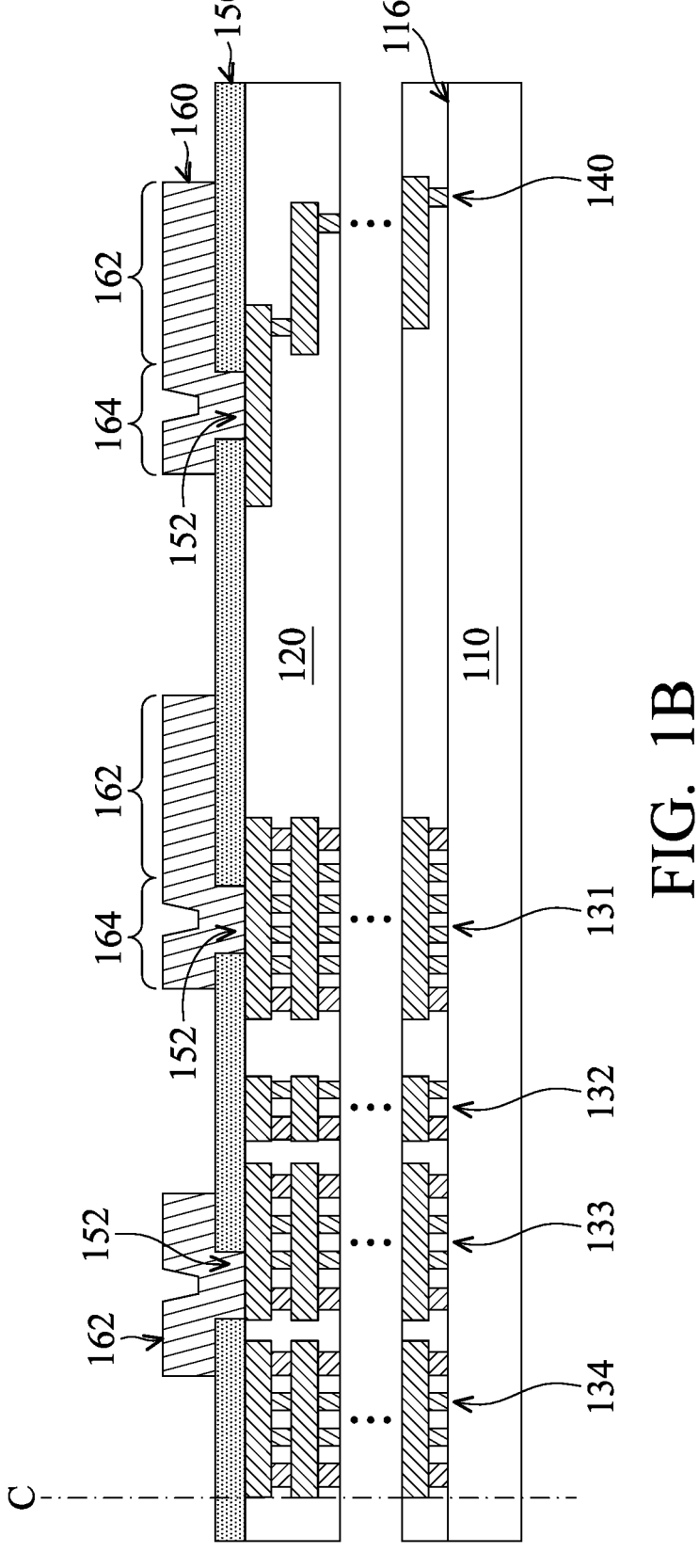

As shown in FIG. 1B, a passivation layer 150 is formed over the dielectric structure 120, the seal ring structures 131, 132, 133, and 134, and the wiring structure 140, in accordance with some embodiments. The passivation layer 150 is made of a dielectric material such as oxides (e.g., silicon oxide), nitrides (e.g., silicon nitride), the like, or a combination thereof, in accordance with some embodiments.

The passivation layer 150 is formed by any suitable process, such as a chemical vapor deposition (CVD) process, a spin-on process, a sputtering process, or a combination thereof, in accordance with some embodiments.

As shown in FIG. 1B, the passivation layer 150 is partially removed to form openings 152 in the passivation layer 150, in accordance with some embodiments. The openings 152 expose portions of the seal ring structures 131 and 133 and the wiring structure 140, in accordance with some embodiments. The removal process includes a photolithography process and an etching process, in accordance with some embodiments.

As shown in FIG. 1B, a pad layer 160 is formed over the passivation layer 150 and in the openings 152, in accordance with some embodiments. The pad layer 160 is in direct contact with the seal ring structures 131 and 133 and the wiring structure 140, in accordance with some embodiments.

The pad layer 160 includes pads 162 and conductive lines 164, in accordance with some embodiments. The conductive lines 164 are connected to the corresponding pads 162, in accordance with some embodiments. The pad layer 160 is made of any suitable conductive material, such as aluminum, an aluminum alloy, or a combination thereof.

Figure 1C:
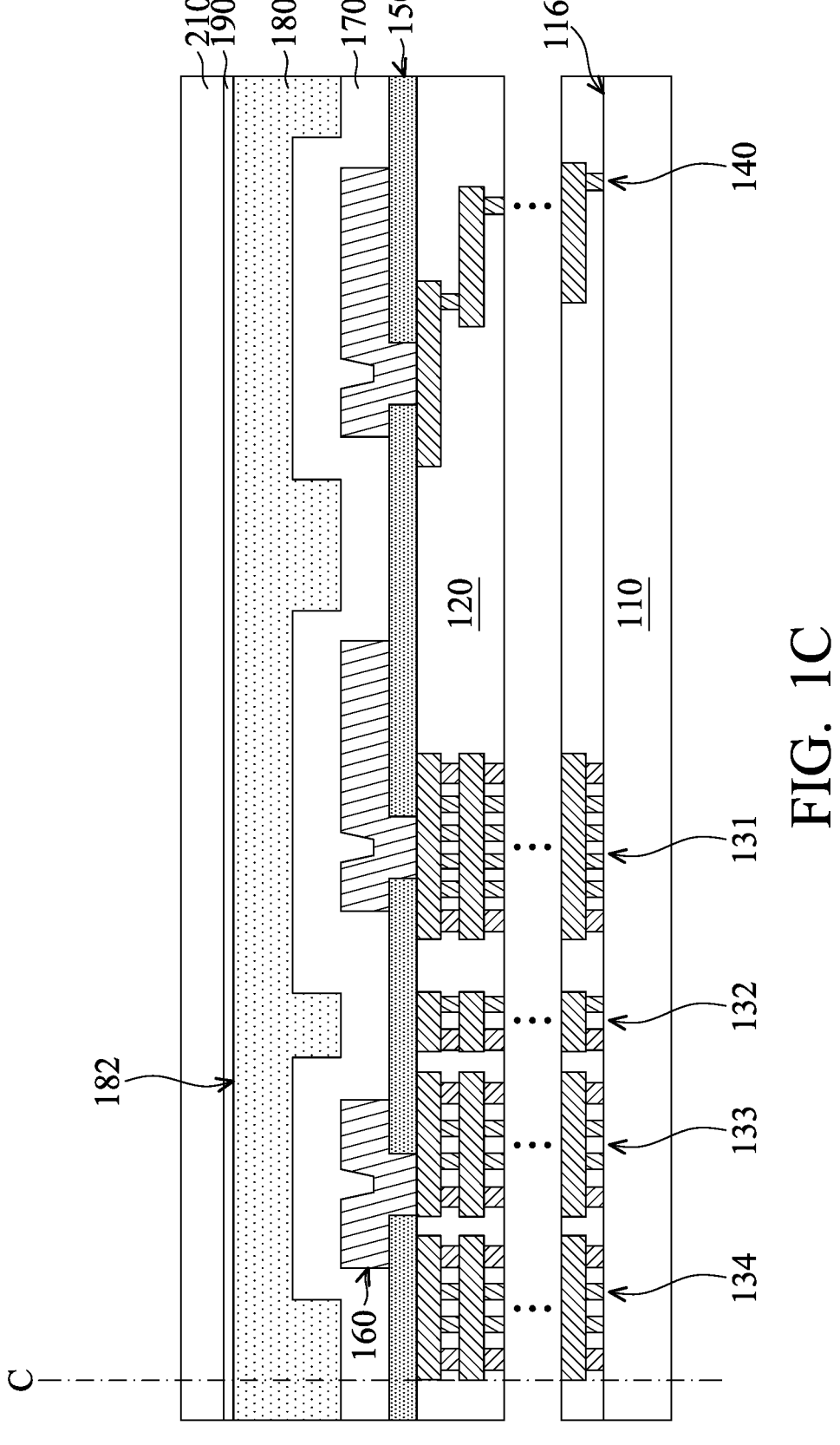

As shown in FIG. 1C, a passivation layer 170 is formed over the passivation layer 150 and the pad layer 160, in accordance with some embodiments. The passivation layer 170 is made of a dielectric material such as oxides (e.g., silicon oxide), nitrides (e.g., silicon nitride), the like, or a combination thereof, in accordance with some embodiments.

The passivation layer 170 is formed by any suitable process, such as a chemical vapor deposition (CVD) process, a spin-on process, a sputtering process, or a combination thereof, in accordance with some embodiments.

As shown in FIG. 1C, a planarization layer 180 is formed over the passivation layer 170, in accordance with some embodiments. The planarization layer 180 has a flat top surface 182, in accordance with some embodiments. The planarization layer 180 is made of a dielectric material such as oxides (e.g., silicon oxide), the like, or a combination thereof, in accordance with some embodiments.

The planarization layer 180 is formed using any suitable process such as a deposition process (or a spin-on process) and a planarization process, in accordance with some embodiments. The deposition process includes a chemical vapor deposition (CVD) process, in accordance with some embodiments.

As shown in FIG. 1C, an etch stop layer 190 is formed over the planarization layer 180, in accordance with some embodiments. The etch stop layer 190 is made of an insulating material, such as a nitrogen-containing material (e.g., silicon nitride), in accordance with some embodiments. The etch stop layer 190 is formed using a deposition process, such as a chemical vapor deposition (CVD) process, an atomic layer deposition (ALD) process, or a physical vapor deposition (PVD) process, in accordance with some embodiments.

As shown in FIG. 1C, a bonding film 210 is formed over the etch stop layer 190, in accordance with some embodiments. The bonding film 210 is positioned over the seal ring structures 131, 132, 133, and 134, the wiring structure 140, and the substrate 110, in accordance with some embodiments.

The bonding film 210 is made of an insulating material, such as oxides (e.g., silicon oxide), nitrides (e.g., silicon oxynitride or silicon carbon nitride), the like, or a combination thereof, in accordance with some embodiments. The bonding film 210 is formed using a deposition process, such as a chemical vapor deposition (CVD) process, an atomic layer deposition (ALD) process, or a physical vapor deposition (PVD) process, in accordance with some embodiments.

Figure 1D:
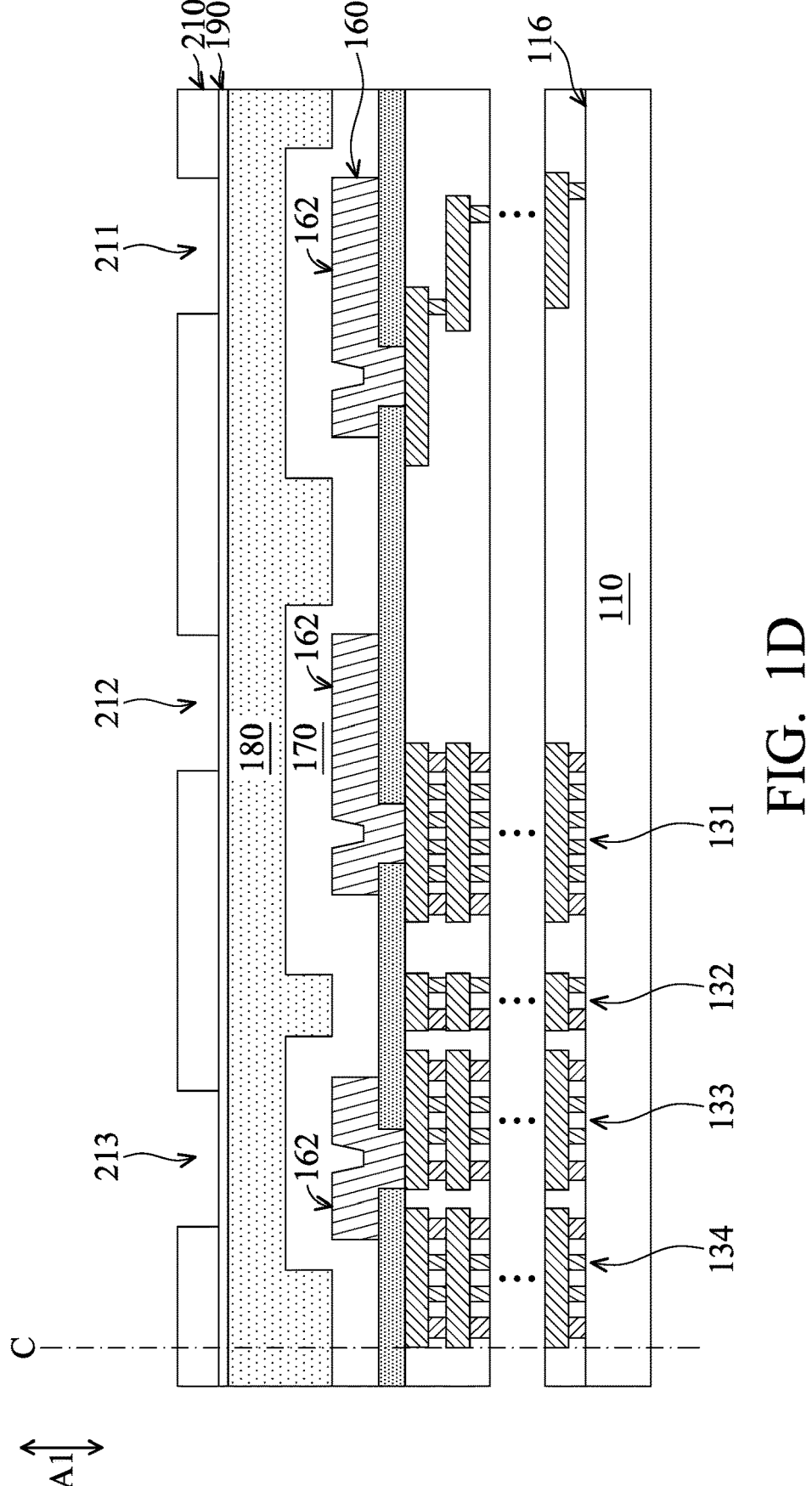

As shown in FIG. 1D, the bonding film 210 is partially removed to form openings 211, 212, and 213 in the bonding film 210, in accordance with some embodiments. The openings 211, 212, and 213 expose portions of the etch stop layer 190, in accordance with some embodiments. The openings 211, 212, and 213 are over the pads 162, in accordance with some embodiments.

The opening 212 overlaps the seal ring structure 131 along an axis A1 perpendicular to a top surface 116 of the substrate 110, in accordance with some embodiments. The opening 213 overlaps the seal ring structures 133 and 134 along the axis A1, in accordance with some embodiments. The removal process includes a photolithography process and an etching process, in accordance with some embodiments.

Figure 1E:
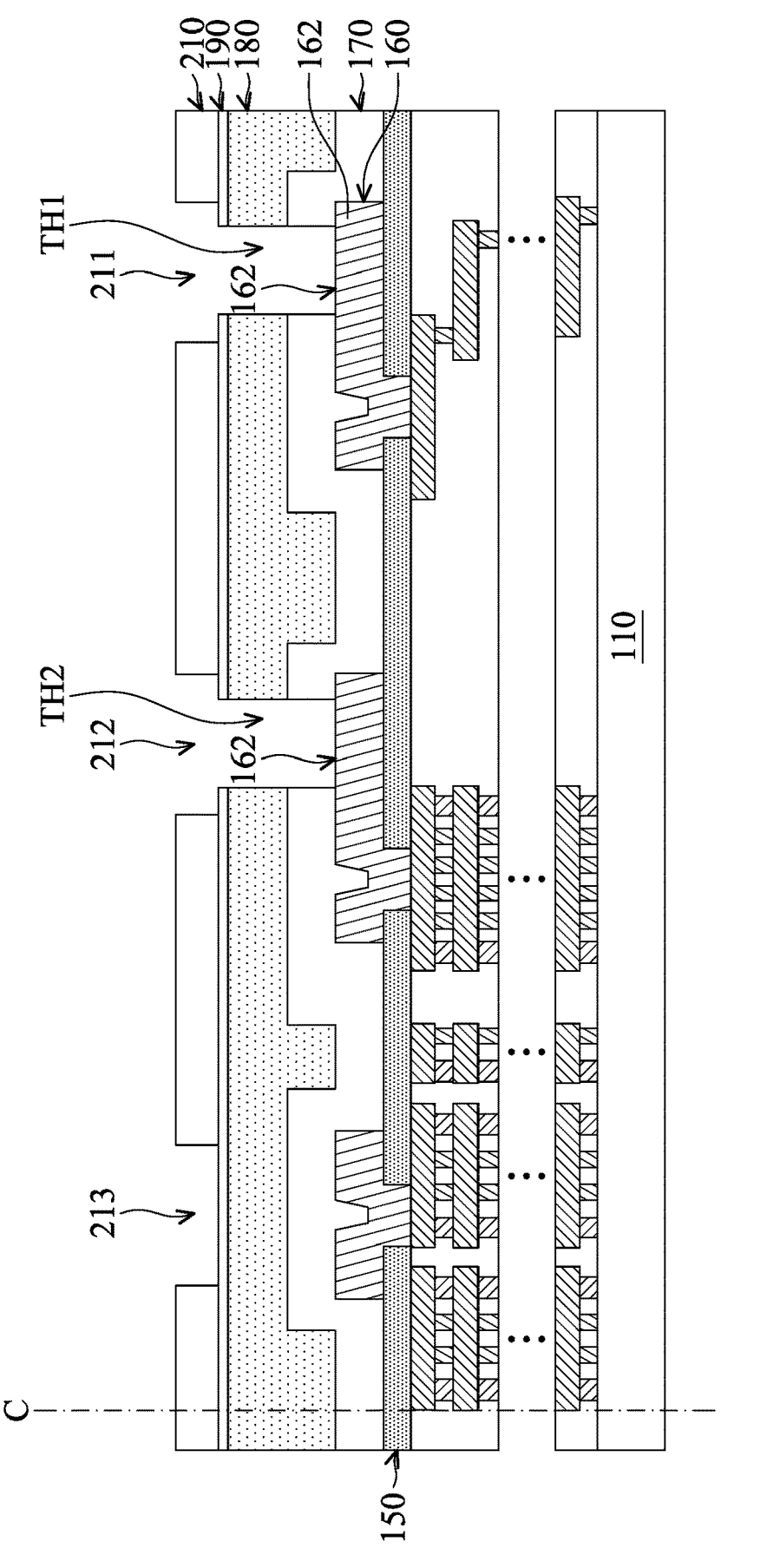

As shown in FIG. 1E, the passivation layer 170, the planarization layer 180, and the etch stop layer 190 are partially removed to form through holes TH1 and TH2 in the passivation layer 170, the planarization layer 180, and the etch stop layer 190, in accordance with some embodiments.

Through holes TH1 and TH2 pass through the passivation layer 170, the planarization layer 180, and the etch stop layer 190 and expose portions of the pads 162, in accordance with some embodiments. The removal process includes a photolithography process and an etching process, in accordance with some embodiments.

Figure 1F:
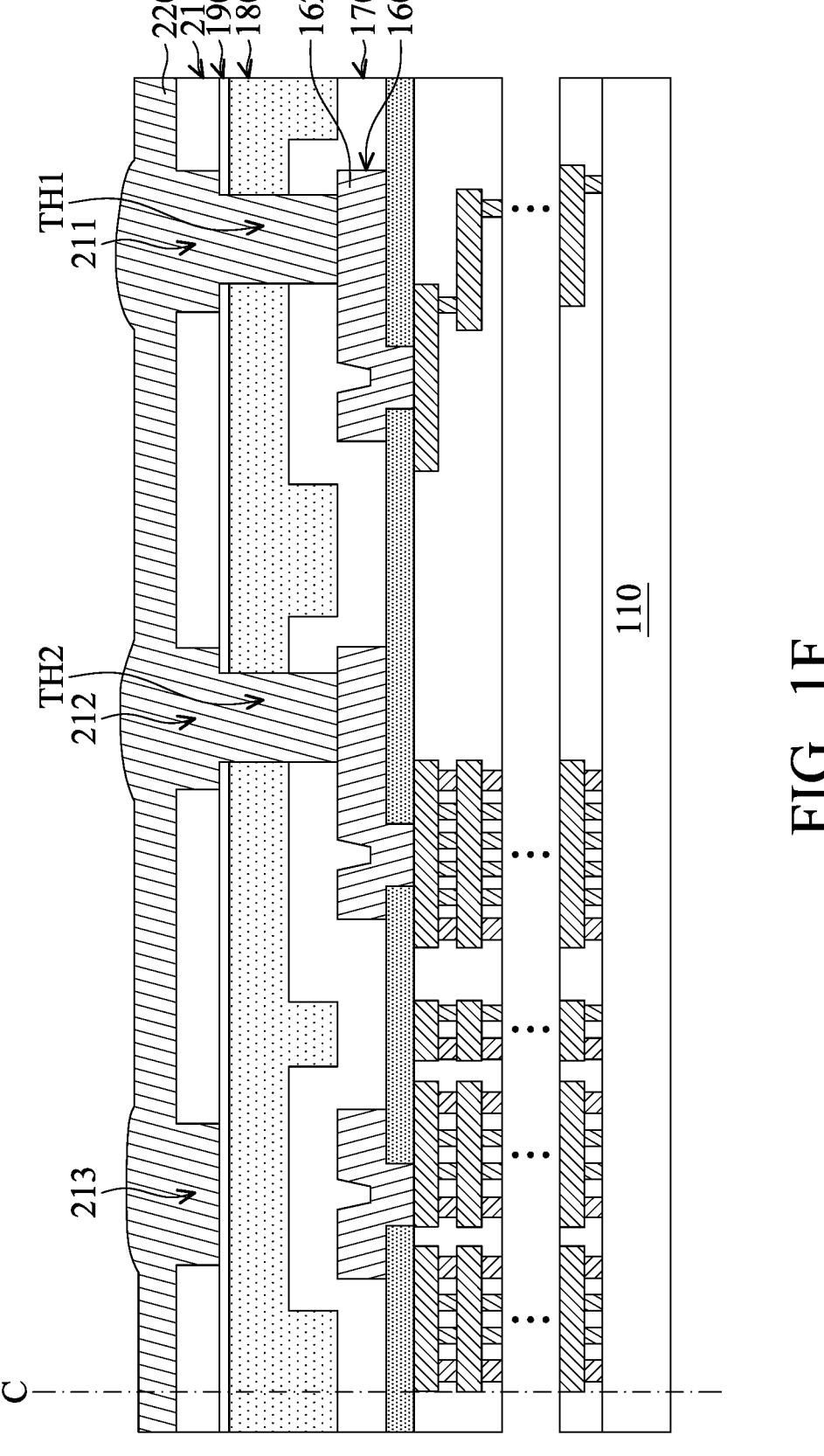

As shown in FIG. 1F, a conductive layer 220 is deposited over the bonding film 210 and in the openings 211, 212, and 213 of the bonding film 210 and the through holes TH1 and TH2, in accordance with some embodiments. The conductive layer 220 is made of any suitable conductive material, such as copper, a copper alloy, silver, gold, aluminum, or a combination thereof.

The deposition process includes a physical vapor deposition (PVD) process, a plating process (e.g., an electrochemical plating (ECP) process), or the like, in accordance with some embodiments.

Figure 1G:
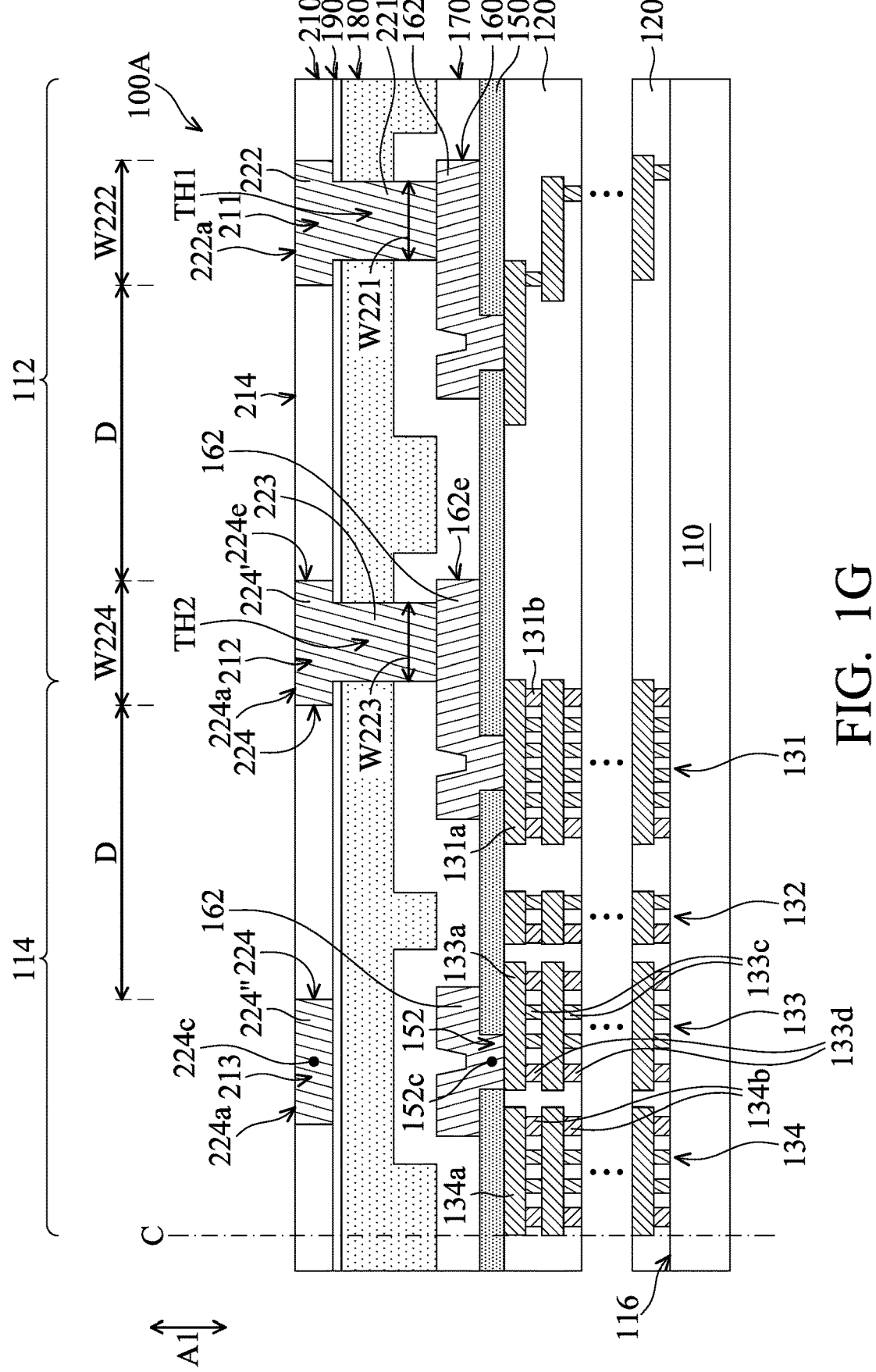

As shown in FIG. 1G, portions of the conductive layer 220 outside of the openings 211, 212, and 213 of the bonding film 210 and the through holes TH1 and TH2 are removed, in accordance with some embodiments. The removal process includes a planarization process such as a chemical mechanical polishing process, in accordance with some embodiments.

As shown in FIG. 1G, after the removal process, the remaining conductive layer 220 includes conductive plugs 221 and 223 and bonding pads 222 and 224, in accordance with some embodiments. The conductive plug 221 is formed in the through hole TH1, in accordance with some embodiments. The bonding pad 222 is formed in the opening 211 of the bonding film 210, in accordance with some embodiments. The bonding pad 222 is in direct contact with the conductive plug 221, in accordance with some embodiments.

The conductive plug 221 is connected between the pad 162 and the bonding pad 222, in accordance with some embodiments. The conductive plug 223 is formed in the through hole TH2, in accordance with some embodiments. In some embodiments, the width W221 of the conductive plug 221 or the width W223 of the conductive plug 223 ranges from about 0.7 μm to 24 μm.

The width W221 is substantially equal to the width of the through hole TH1, and the width W223 is substantially equal to the width of the through hole TH2, in accordance with some embodiments. If the width W221 or W223 is less than 0.7 μm, the aspect ratio of the through hole TH1 or TH2 may be too large, which adversely affects the formation of the conductive plugs 221 and 223.

The bonding pads 224 are formed in the openings 212 and 213 of the bonding film 210, in accordance with some embodiments. The bonding pads 224 overlap the pads 162 thereunder, in accordance with some embodiments. The bonding pads 222 and 224 are spaced apart from each other by the same distance D, in accordance with some embodiments. The width W222 is substantially equal to the width W224, in accordance with some embodiments.

In some embodiments, the width W222 of the bonding pad 222 or the width W224 of the bonding pad 224 ranges from about 1 μm to 3.5 μm. If the width W222 or W224 is less than 1 μm, the bonding area (i.e., the area of the top surface 222a or 224a of the bonding pad 222 or 224) may be too small, which adversely affects the bondability of the bonding pad 222 or 224.

If the width W222 or W224 is greater than 3.5 μm, the removal speed of the central portion of the bonding pad 222 or 224 is greater than that of the peripheral portion of the bonding pad 222 or 224, which adversely affects the planarity of the bonding pad 222 or 224.

In some embodiments, the top surfaces 224a of the bonding pads 224 and the top surface 222a of the bonding pad 222 are substantially level with (or coplanar with) a top surface 214 of the bonding film 210. The bonding pads 222 and 224 and the bonding film 210 have the same thickness, in accordance with some embodiments.

The bonding pads 224 include bonding pads 224' and 224", in accordance with some embodiments. The bonding pad 224' is in the opening 212, in accordance with some embodiments. The bonding pad 224' is in direct contact with the conductive plug 223, in accordance with some embodiments. The conductive plug 223 is connected between the pad 162 and the bonding pad 224', in accordance with some embodiments.

The bonding pad 224' overlaps the seal ring structure 131 along the axis A1, in accordance with some embodiments. The bonding pad 224' overlaps the ring strip structure 131a and the ring wall structure 131b, in accordance with some embodiments. In some embodiments, an edge 224e of the bonding pad 224' is substantially aligned with an edge 162e of the pad 162 thereunder along the axis A1.

The bonding pad 224" is in the opening 213, in accordance with some embodiments. The bonding pad 224" overlaps the seal ring structures 133 and 134 along the axis A1, in accordance with some embodiments. The bonding pad 224" overlaps the ring strip structures 133a and 134a, the pillars 133c, and the ring wall structure 133d and 134b, in accordance with some embodiments.

The center 224c of the bonding pad 224" is substantially aligned with the center 152c of the opening 152 under the bonding pad 224" along the axis A1, in accordance with some embodiments.

Figure 1H:
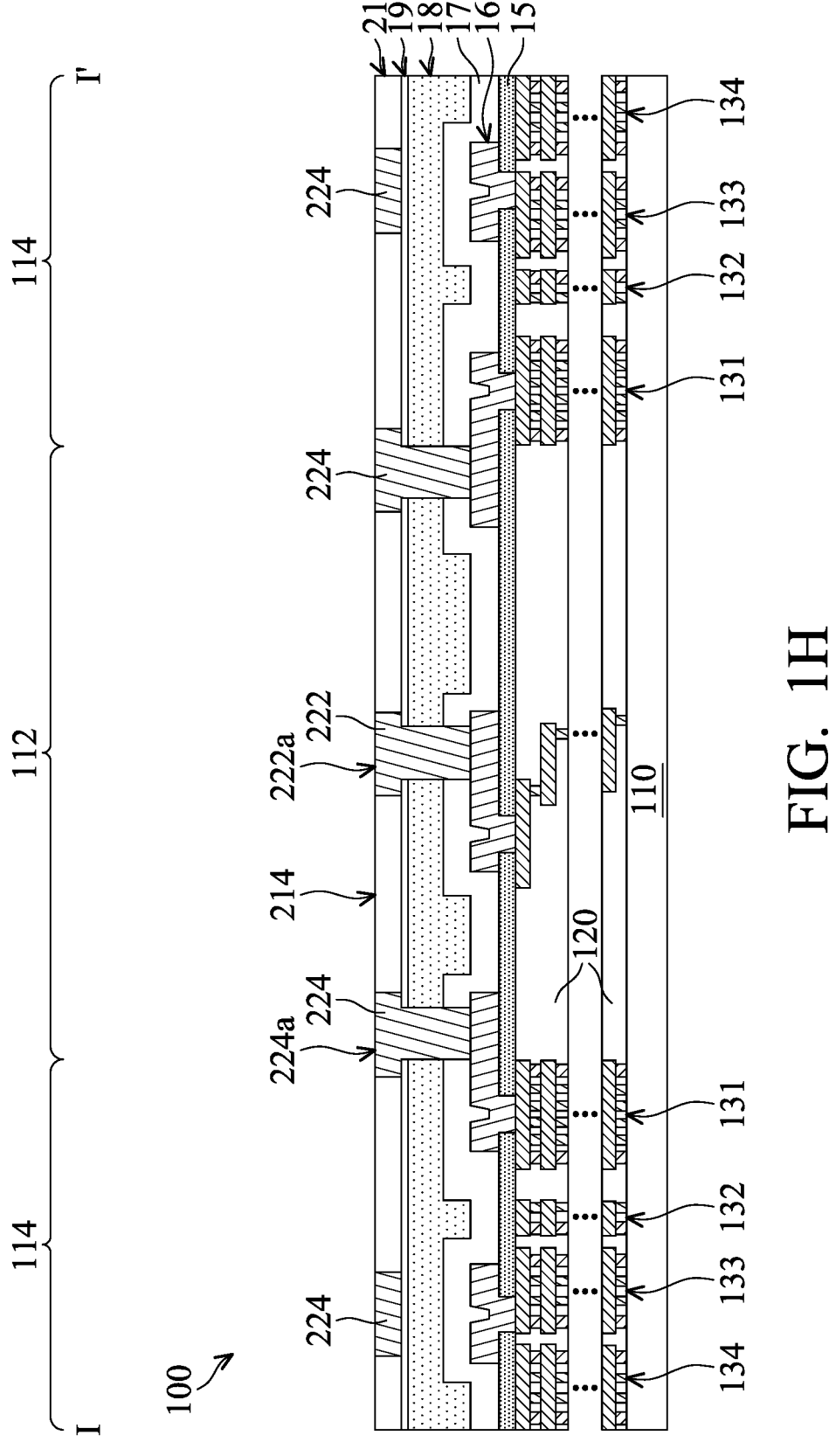
Figures 1, 1H:
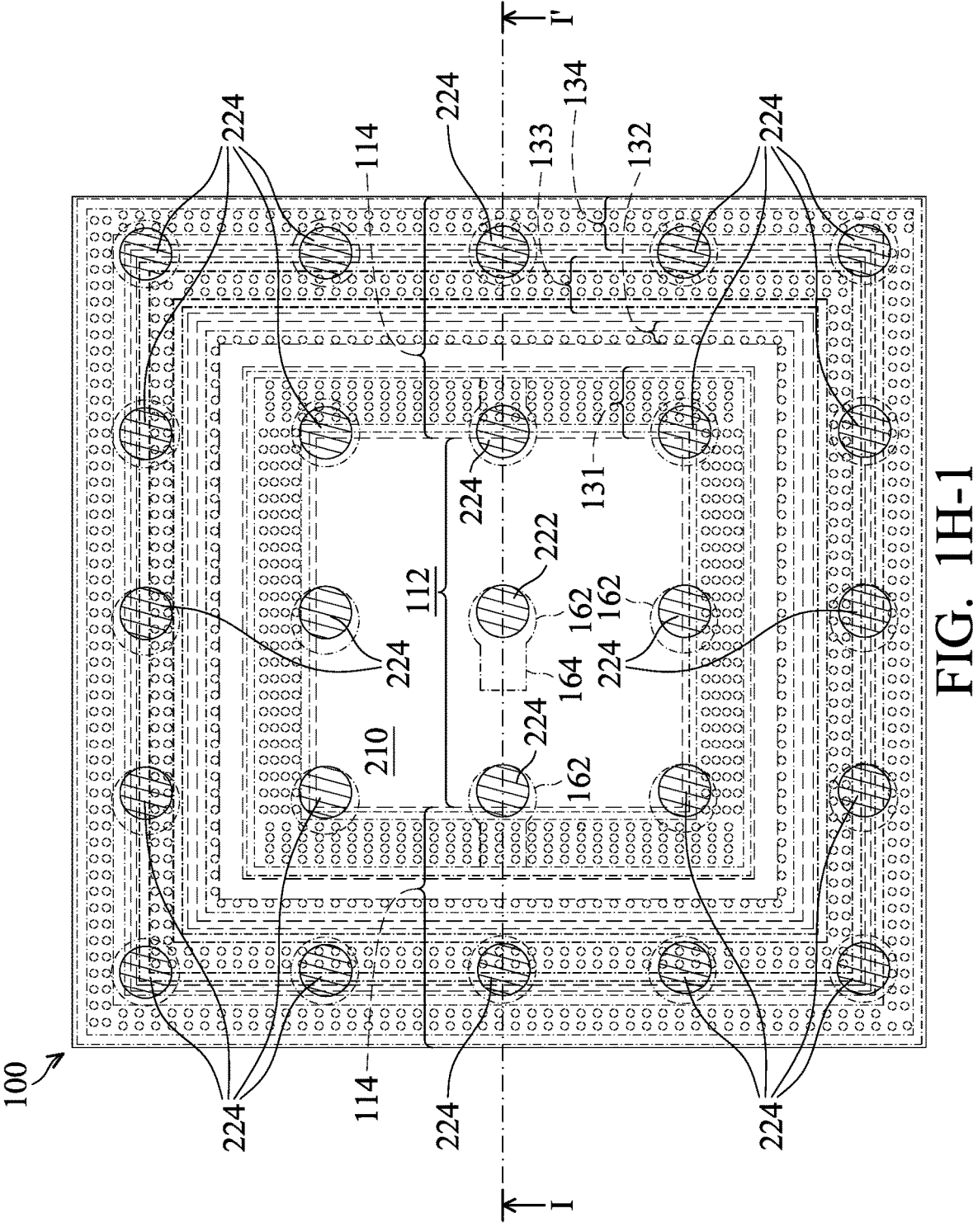

FIG. 1H-1 is a top view of the semiconductor device structure of FIG. 1H, in accordance with some embodiments. FIG. 1H is a cross-sectional view illustrating the semiconductor device structure along a sectional line I-I' in FIG. 1H-1, in accordance with some embodiments.

As shown in FIGS. 1G, 1H, and 1H-1, a dicing process is performed over the substrate 110, the dielectric structure 120, the passivation layers 150 and 170, the planarization layer 180, the etch stop layer 190, and the bonding film 210, in accordance with some embodiments.

The dicing process cuts through the substrate 110, the dielectric structure 120, the passivation layers 150 and 170, the planarization layer 180, the etch stop layer 190, and the bonding film 210 along the scribe lines C so as to form individual chip structures 100, in accordance with some embodiments. FIG. 1H only shows one of the chip structures 100, in accordance with some embodiments.

Since the application forms the additional bonding pads 224 in the seal ring region 114, the number of the bonding pads is greatly increased, which improves the bondability of the chip structure 100, in accordance with some embodiments.

Figure 2A:
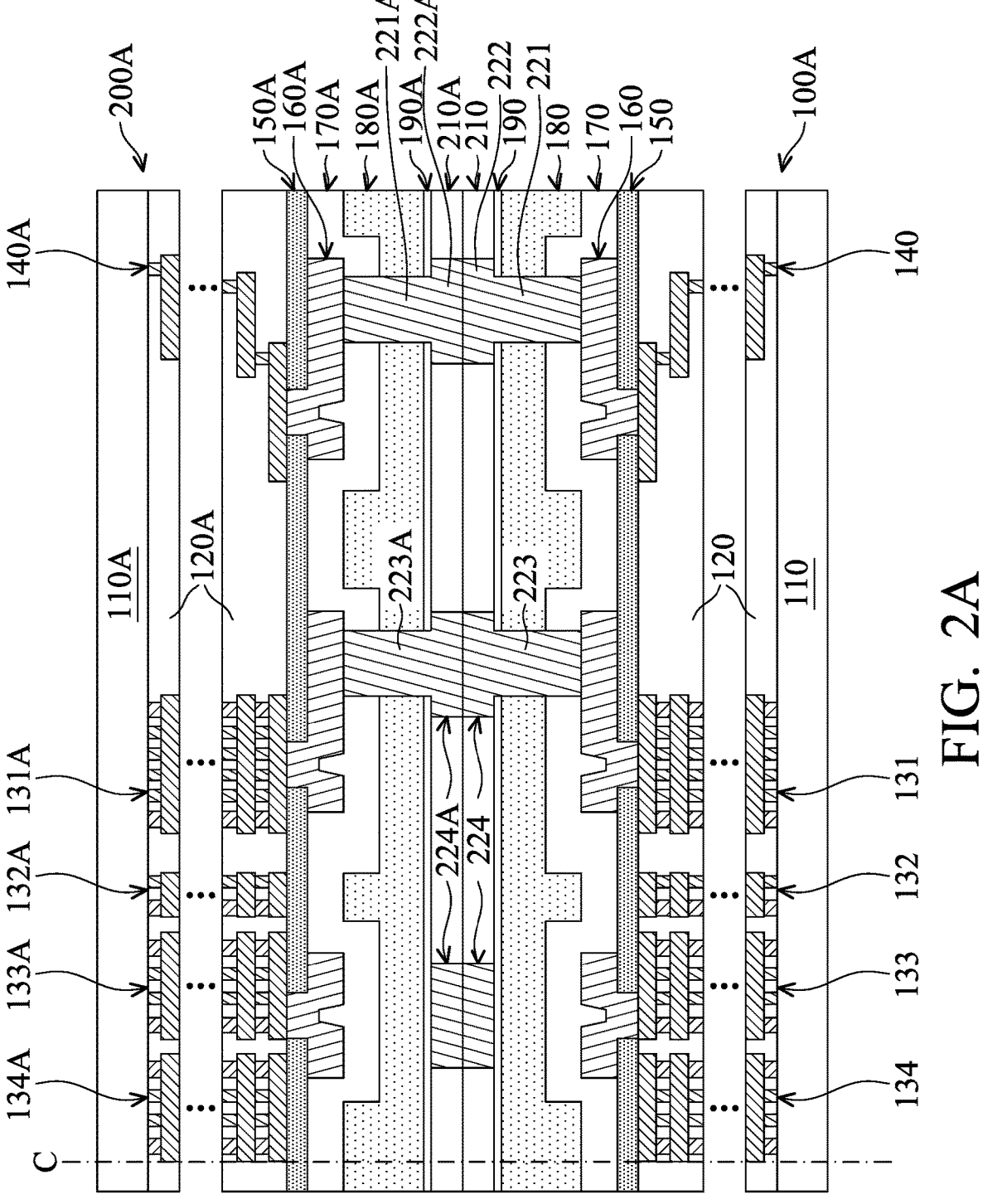
FIGS. 2A-2B are cross-sectional views of various stages of a process for forming a semiconductor device structure, in accordance with some embodiments.
Figure 2B:
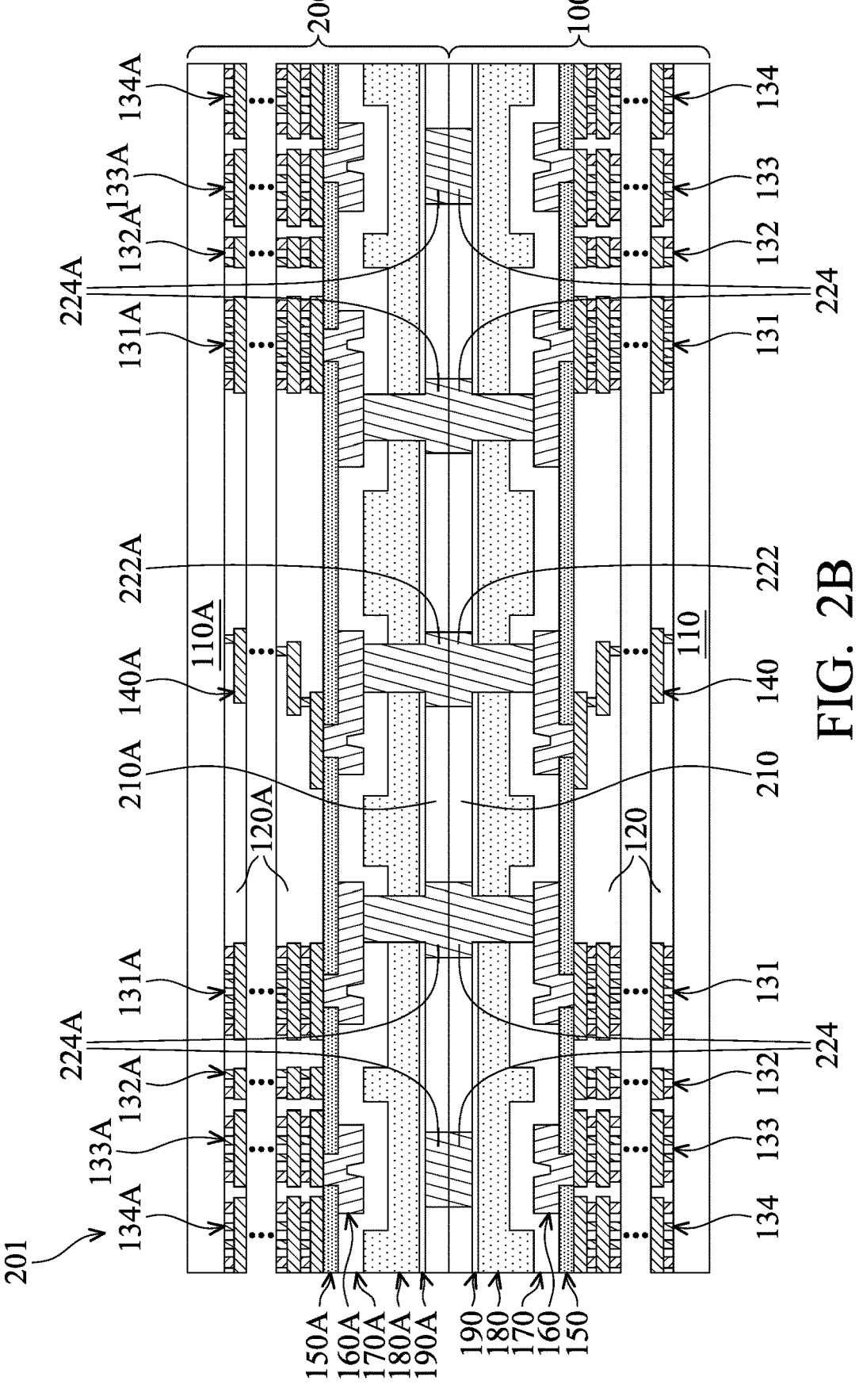

FIGS. 2A-2B are cross-sectional views of various stages of a process for forming a semiconductor device structure, in accordance with some embodiments. As shown in FIG. 2A, after the step of FIG. 1G, a semiconductor structure 200A is bonded to the semiconductor structure 100A of FIG. 1G, in accordance with some embodiments.

The semiconductor structure 200A may be similar to the semiconductor structure 100A of FIG. 1G. The semiconductor structure 200A optionally includes a substrate 110A, a dielectric structure 120A, seal ring structures 131A, 132A, 133A, and 134A, a wiring structure 140A, a passivation layer 150A, a pad layer 160A, a passivation layer 170A, a planarization layer 180A, an etch stop layer 190A, a bonding film 210A, conductive plugs 221A and 223A, and bonding pads 222A and 224A, in accordance with some embodiments.

In the semiconductor structures 100A and 200A, elements designated by similar reference numbers have structures and materials that are the same or similar, in accordance with some embodiments. In some embodiments, the layout of the wiring structure 140A is different from the layout of the wiring structure 140.

The bonding pads 222A of the semiconductor structure 200A are directly bonded to the bonding pads 222 of the semiconductor structure 100A, in accordance with some embodiments. The bonding pads 224A of the semiconductor structure 200A are directly bonded to the bonding pads 224 of the semiconductor structure 100A, in accordance with some embodiments.

The bonding film 210A of the semiconductor structure 200A is directly bonded to the bonding film 210 of the semiconductor structure 100A, in accordance with some embodiments. The temperature of the bonding process ranges from about 200° C. to about 400° C., in accordance with some embodiments.

As shown in FIGS. 2A and 2B, a dicing process is performed over the semiconductor structures 100A and 200A, in accordance with some embodiments. The dicing process cuts through the semiconductor structures 100A and 200A so as to form individual semiconductor device structures 201, in accordance with some embodiments.

FIG. 2B only shows one of the semiconductor device structures 201, in accordance with some embodiments. Each semiconductor device structure 201 includes a chip structure 100 and a chip structure 200, in accordance with some embodiments. The chip structure 100 is cut from the semiconductor structure 100A, in accordance with some embodiments. The chip structure 200 is cut from the semiconductor structure 200A, in accordance with some embodiments.

Since the application forms the additional bonding pads 224 and 224A between the seal ring structures 131, 131A, 132, 132A, 133, 133A, 134 and 134A, the bonding area of the bonding pads is greatly increased, which improves the reliability of the semiconductor device structure 201, in accordance with some embodiments.

Figure 3A:
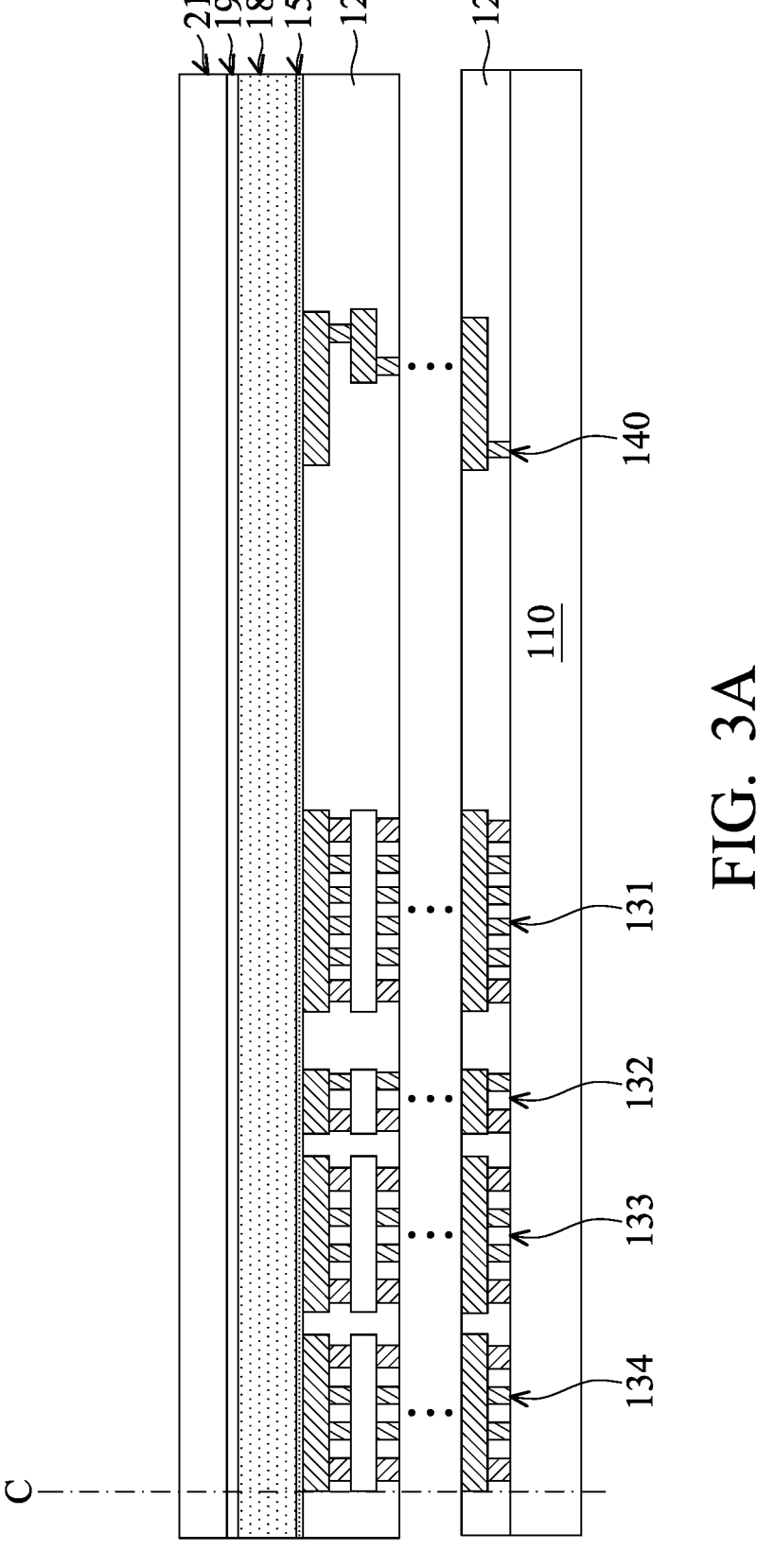
FIGS. 3A-3D are cross-sectional views of various stages of a process for forming a semiconductor device structure, in accordance with some embodiments.

FIGS. 3A-3D are cross-sectional views of various stages of a process for forming a semiconductor device structure, in accordance with some embodiments. As shown in FIG. 3A, the steps of FIGS. 1A-1C are performed, except that the pad layer 160 and the passivation layer 170 are not formed, in accordance with some embodiments.

Figure 3B:
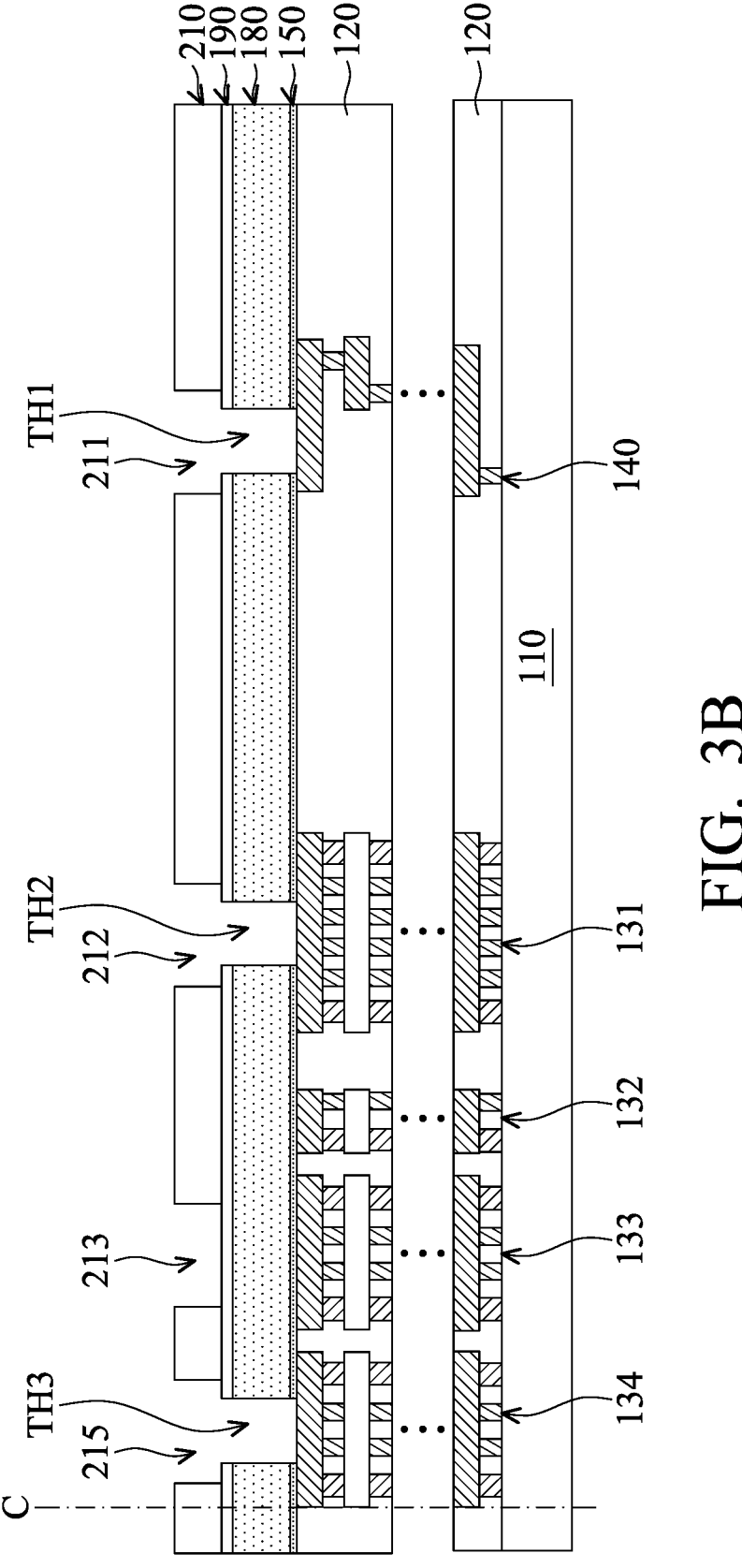

As shown in FIG. 3B, the steps of FIGS. 1D-1E are performed to form openings 211, 212, 213, and 215 in the bonding film 210 and through holes TH1, TH2, and TH3 in the passivation layer 150, the planarization layer 180, and the etch stop layer 190, in accordance with some embodiments.

The through holes TH1, TH2, and TH3 are connected to the openings 211, 212, and 215 respectively, in accordance with some embodiments. The through holes TH1, TH2, and TH3 expose portions of the wiring structure 140 and the seal ring structures 131 and 134 respectively, in accordance with some embodiments.

Figure 3C:
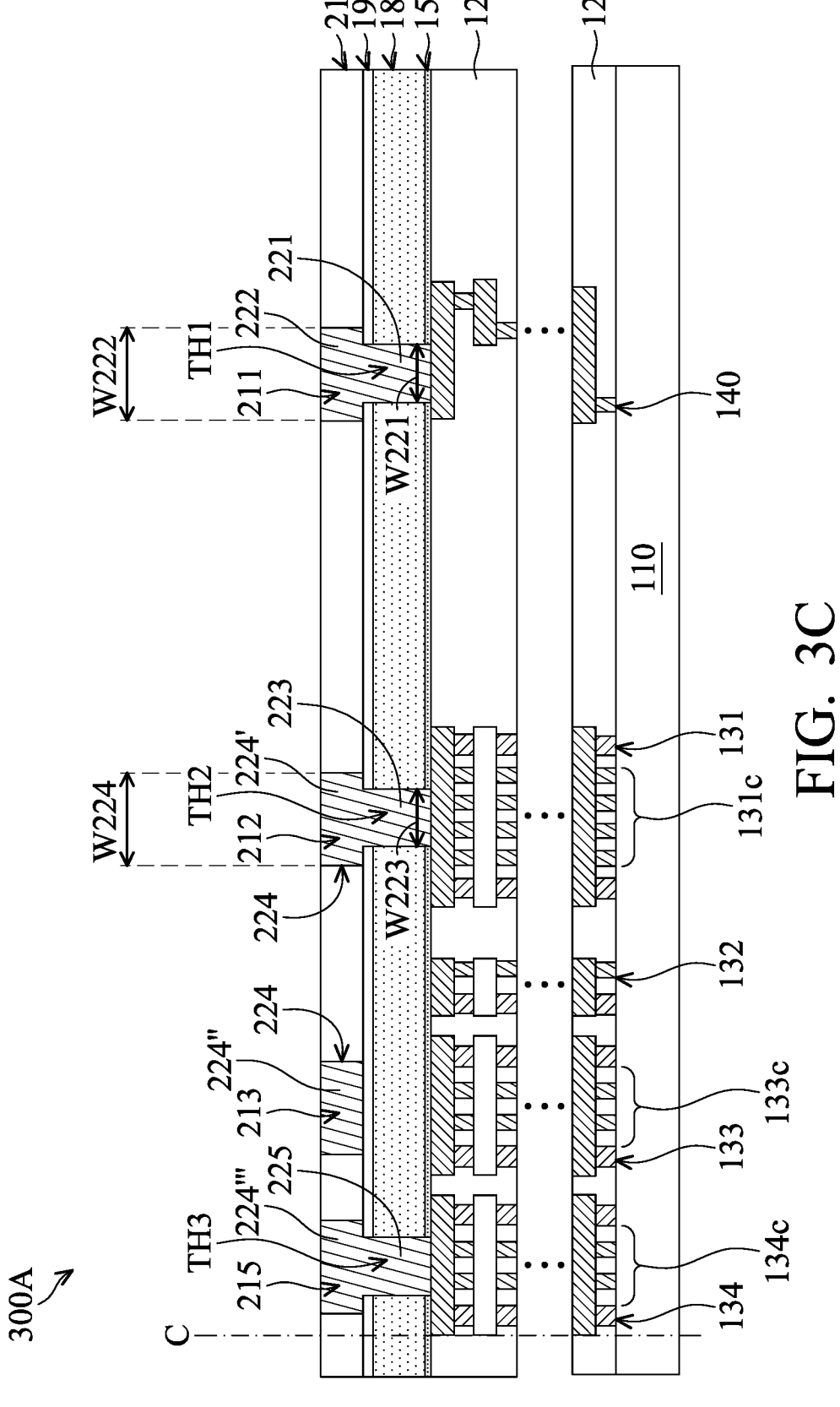

As shown in FIG. 3C, the steps of FIGS. 1F-1G are performed to form conductive plugs 221, 223, and 225 and bonding pads 222 and 224, in accordance with some embodiments. The conductive plugs 221, 223, and 225 are formed in the through holes TH1, TH2, and TH3 respectively, in accordance with some embodiments. In some embodiments, the width W221 of the conductive plug 221 or the width W223 of the conductive plug 223 ranges from about 0.8 μm to 1.3 μm.

The bonding pads 222 and 224 are formed in the openings 211, 212, 213, and 215 of the bonding film 210 respectively, in accordance with some embodiments. In some embodiments, the width W222 of the bonding pad 222 or the width W224 of the bonding pad 224 ranges from about 1 μm to 1.5 μm. The width W222 is substantially equal to the width W224, in accordance with some embodiments.

The bonding pad 224' (of the bonding pads 224) is over a central portion 131c of the seal ring structure 131, in accordance with some embodiments. The bonding pad 224" (of the bonding pads 224) is over a central portion 133c of the seal ring structure 133, in accordance with some embodiments. The bonding pad 224''' (of the bonding pads 224) is over a central portion 134c of the seal ring structure 134, in accordance with some embodiments.

The conductive plug 223 is between and in direct contact with the seal ring structure 131 and the bonding pad 224 thereover, in accordance with some embodiments. The conductive plug 225 is between and in direct contact with the seal ring structure 134 and the bonding pad 224 thereover, in accordance with some embodiments.

Figure 3D:
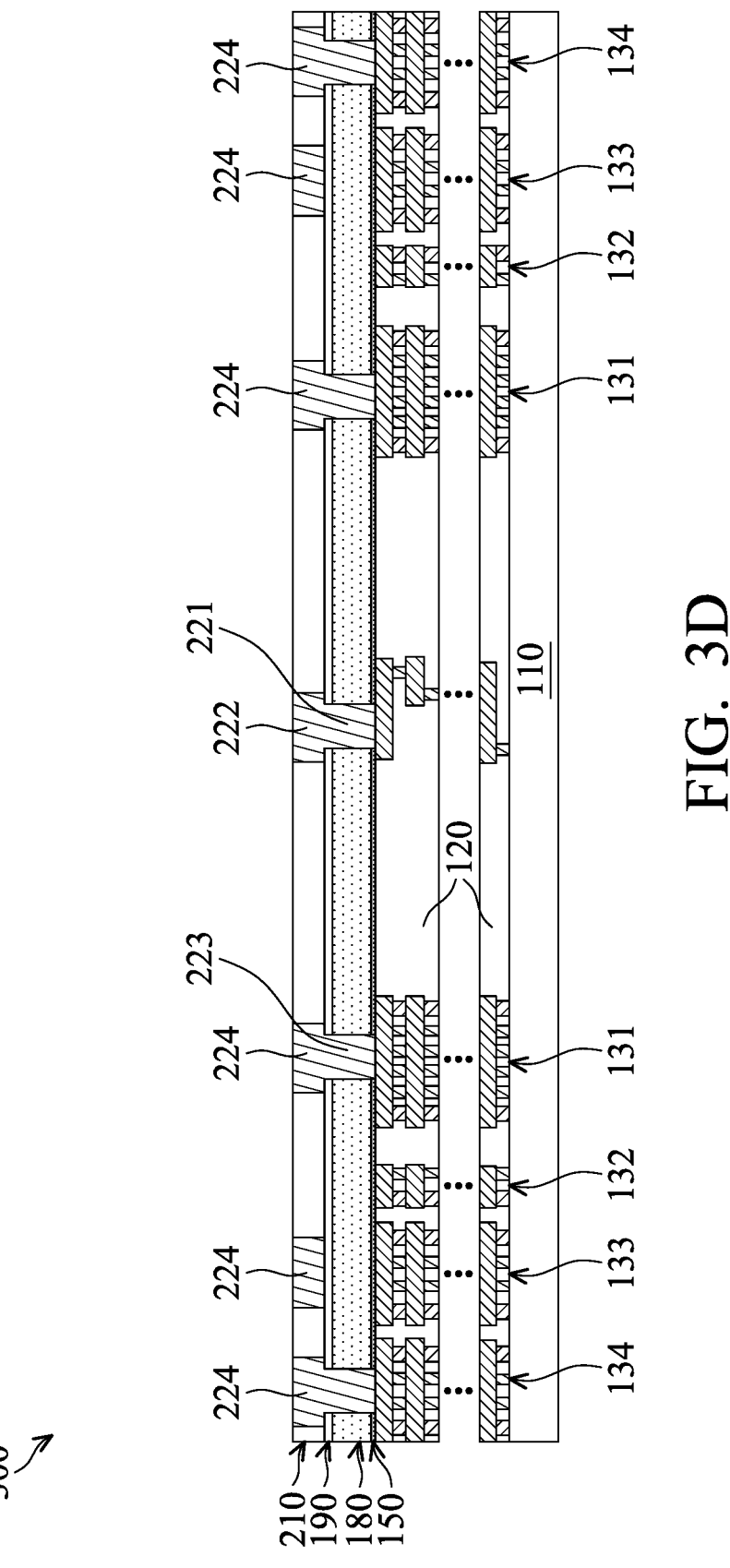

As shown in FIGS. 3C-3D, a dicing process is performed over the substrate 110, the dielectric structure 120, the passivation layer 150, the planarization layer 180, the etch stop layer 190, and the bonding film 210, in accordance with some embodiments.

The dicing process cuts through the substrate 110, the dielectric structure 120, the passivation layer 150, the planarization layer 180, the etch stop layer 190, and the bonding film 210 along the scribe lines C so as to form individual chip structures 300, in accordance with some embodiments. FIG. 3D only shows one of the chip structures 300, in accordance with some embodiments.

Figure 4A:
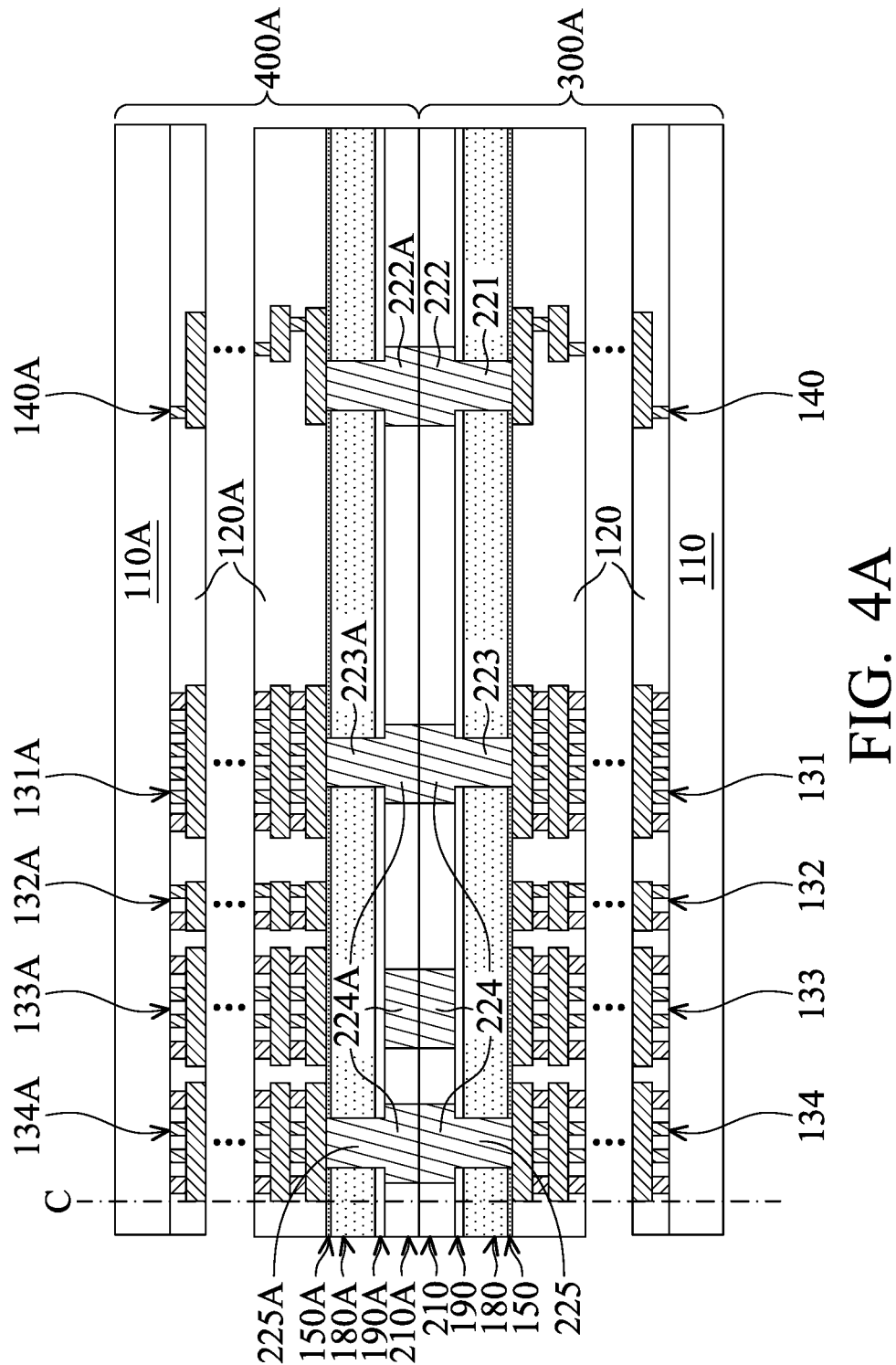
FIGS. 4A-4B are cross-sectional views of various stages of a process for forming a semiconductor device structure, in accordance with some embodiments.
Figure 4B:
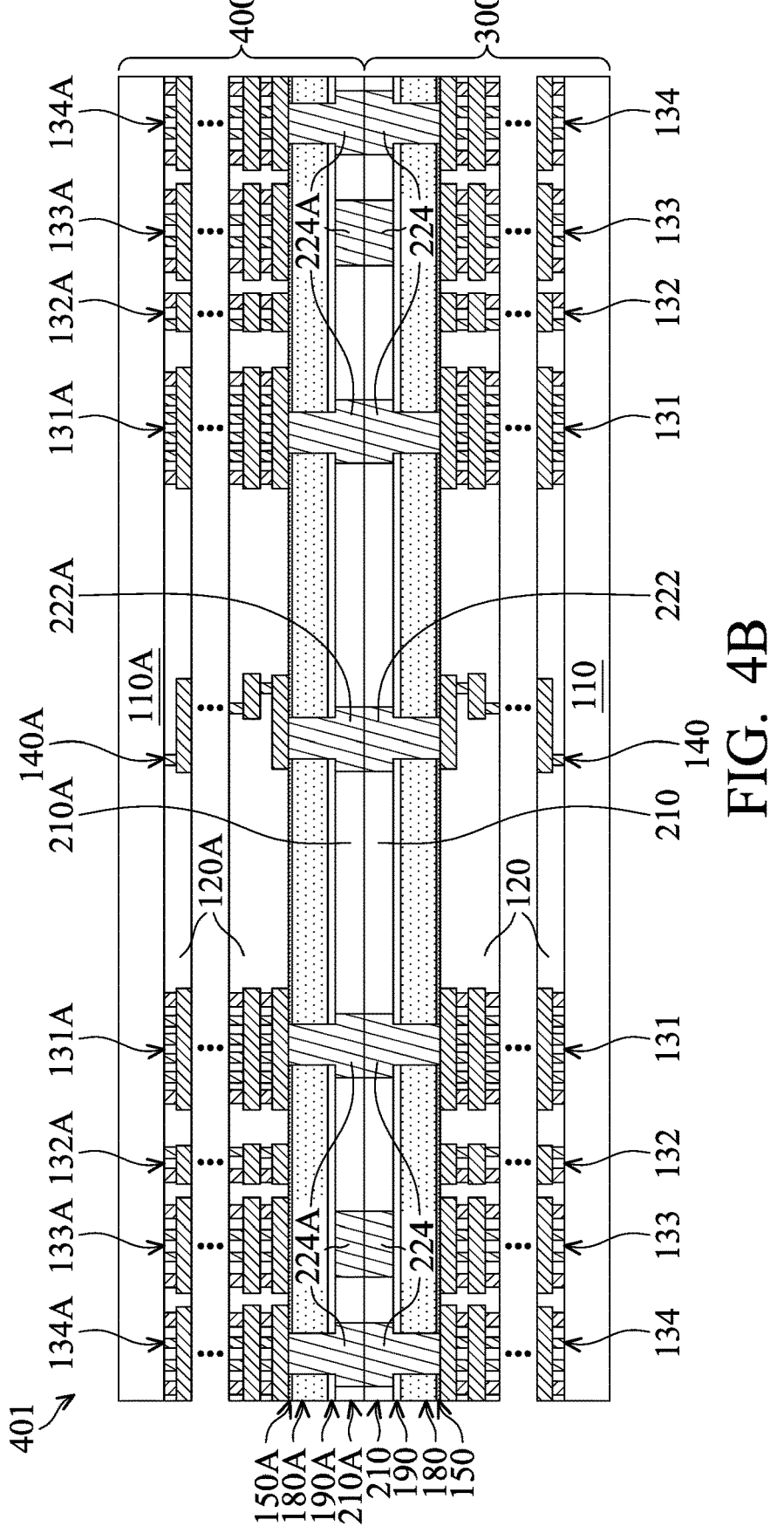

FIGS. 4A-4B are cross-sectional views of various stages of a process for forming a semiconductor device structure, in accordance with some embodiments. As shown in FIG. 4A, after the step of FIG. 3C, a semiconductor structure 400A is bonded to the semiconductor structure 300A of FIG. 3C, in accordance with some embodiments.

The semiconductor structure 400A may be similar to the semiconductor structure 300A of FIG. 3C. The semiconductor structure 400A optionally includes a substrate 110A, a dielectric structure 120A, seal ring structures 131A, 132A, 133A, and 134A, a wiring structure 140A, a passivation layer 150A, a planarization layer 180A, an etch stop layer 190A, a bonding film 210A, and conductive plugs 221A, 223A and 225A and bonding pads 222A and 224A, in accordance with some embodiments.

In the semiconductor structures 300A and 400A, elements designated by similar reference numbers have structures and materials that are the same or similar, in accordance with some embodiments. In some embodiments, the layout of the wiring structure 140A is different from the layout of the wiring structure 140.

The bonding pads 222A of the semiconductor structure 400A are directly bonded to the bonding pads 222 of the semiconductor structure 300A, in accordance with some embodiments. The bonding pads 224A of the semiconductor structure 400A are directly bonded to the bonding pads 224 of the semiconductor structure 300A, in accordance with some embodiments.

The bonding film 210A of the semiconductor structure 400A is directly bonded to the bonding film 210 of the semiconductor structure 300A, in accordance with some embodiments. The temperature of the bonding process ranges from about 200° C. to about 400° C., in accordance with some embodiments.

As shown in FIGS. 4A and 4B, a dicing process is performed over the semiconductor structures 300A and 400A, in accordance with some embodiments. The dicing process cuts through the semiconductor structures 300A and 400A along the scribe lines C so as to form individual semiconductor device structures 401, in accordance with some embodiments.

FIG. 4B only shows one of the semiconductor device structures 401, in accordance with some embodiments. Each semiconductor device structure 401 includes a chip structure 300 and a chip structure 400, in accordance with some embodiments. The chip structure 300 is cut from the semiconductor structure 300A, in accordance with some embodiments. The chip structure 400 is cut from the semiconductor structure 400A, in accordance with some embodiments.

Figure 5A:
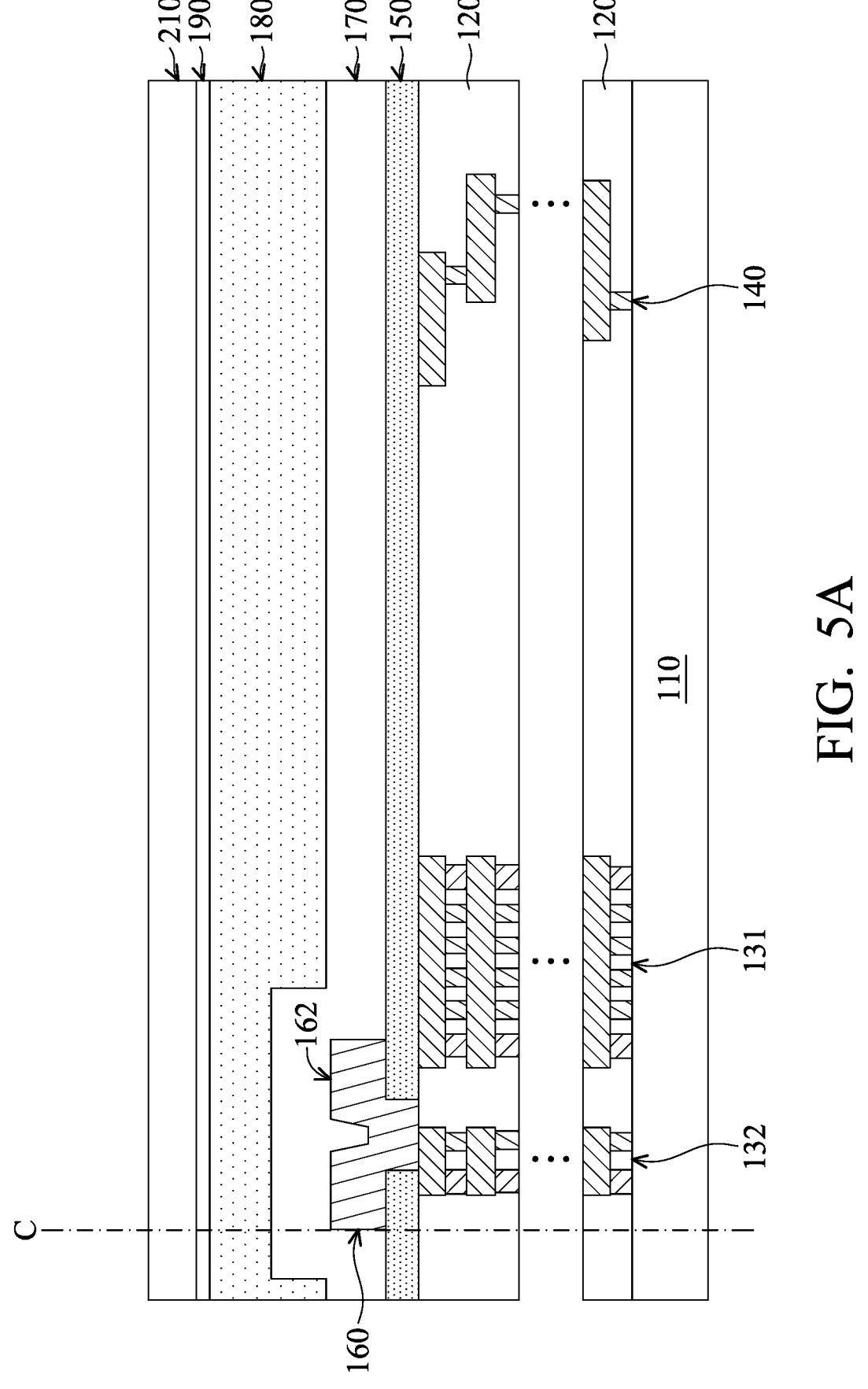
FIGS. 5A-5D are cross-sectional views of various stages of a process for forming a semiconductor device structure, in accordance with some embodiments.

FIGS. 5A-5D are cross-sectional views of various stages of a process for forming a semiconductor device structure, in accordance with some embodiments. As shown in FIG. 5A, the steps of FIGS. 1A-1C are performed, except that the seal ring structures 133 and 134 are not formed and the pad layer 160 is formed over the seal ring structure 132, in accordance with some embodiments.

Figure 5B:
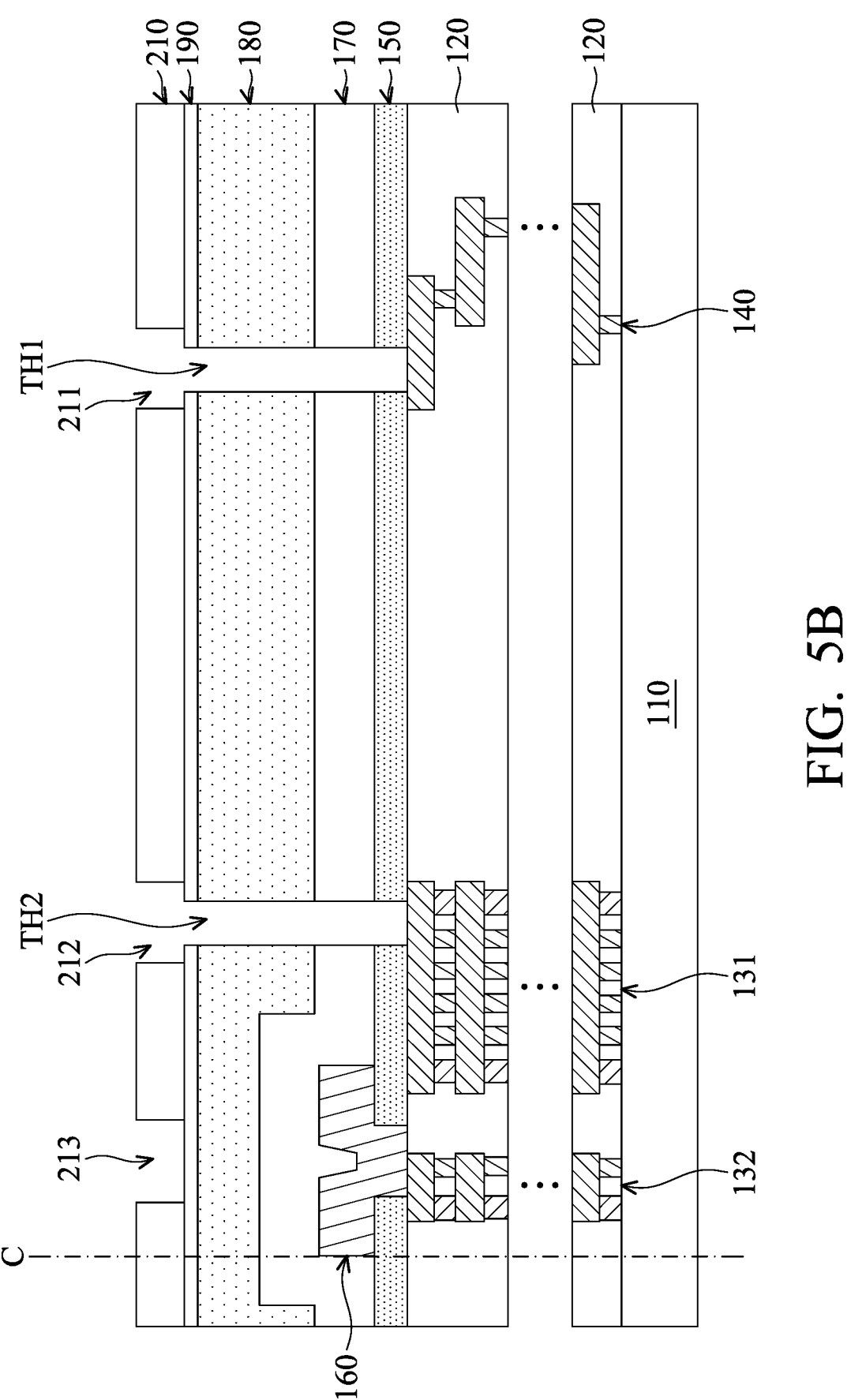

As shown in FIG. 5B, the steps of FIGS. 1D-1E are performed to form openings 211, 212, and 213 in the bonding film 210 and through holes TH1 and TH2 in the passivation layers 150 and 170, the planarization layer 180, and the etch stop layer 190, in accordance with some embodiments.

The through holes TH1 and TH2 are connected to the openings 211 and 212 respectively, in accordance with some embodiments. The through holes TH1 and TH2 expose portions of the wiring structure 140 and the seal ring structure 131 respectively, in accordance with some embodiments.

Figure 5C:
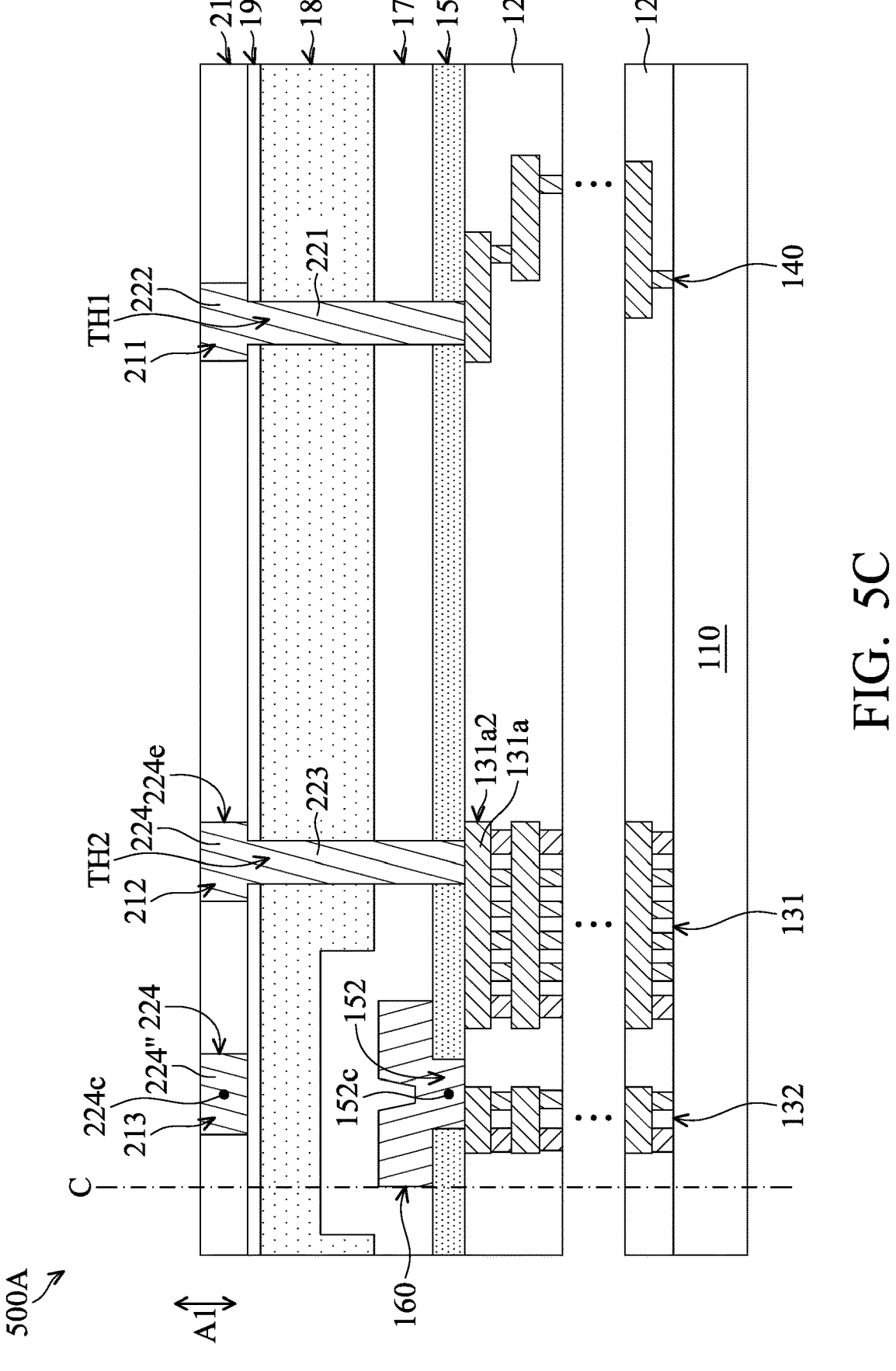

As shown in FIG. 5C, the steps of FIGS. 1F-1G are performed to form conductive plugs 221 and 223 and bonding pads 222 and 224, in accordance with some embodiments. The conductive plugs 221 and 223 are formed in the through holes TH1 and TH2 respectively, in accordance with some embodiments. The bonding pads 222 and 224 are formed in the openings 211, 212, and 213 of the bonding film 210 respectively, in accordance with some embodiments.

The conductive plug 223 is between and in direct contact with the seal ring structure 131 and the bonding pad 224 thereover, in accordance with some embodiments. In some embodiments, an edge 224e of the bonding pad 224 is substantially aligned with an edge 131a2 of the ring strip structures 131a of the seal ring structure 131 along the axis A1. The center 224c of the bonding pad 224″ (of the bonding pads 224) is substantially aligned with the center 152c of the opening 152 of the passivation layer 150 along the axis A1, in accordance with some embodiments.

Figure 5D:
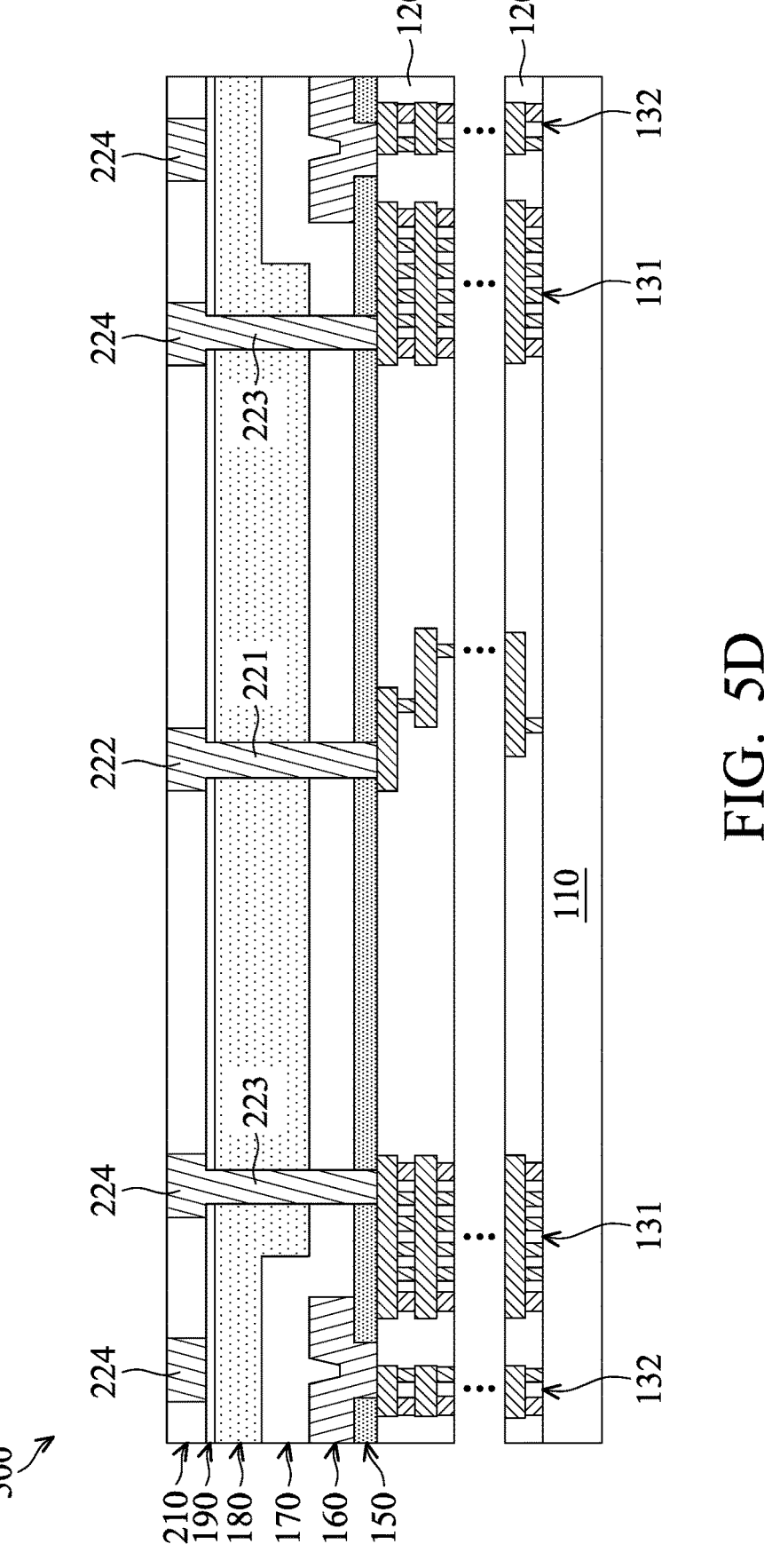

As shown in FIGS. 5C-5D, a dicing process is performed over the substrate 110, the dielectric structure 120, the passivation layers 150 and 170, the planarization layer 180, the etch stop layer 190, and the bonding film 210, in accordance with some embodiments.

The dicing process cuts through the substrate 110, the dielectric structure 120, the passivation layers 150 and 170, the planarization layer 180, the etch stop layer 190, and the bonding film 210 along the scribe lines C so as to form individual chip structures 500, in accordance with some embodiments. FIG. 5D only shows one of the chip structures 500, in accordance with some embodiments.

Figure 6A:
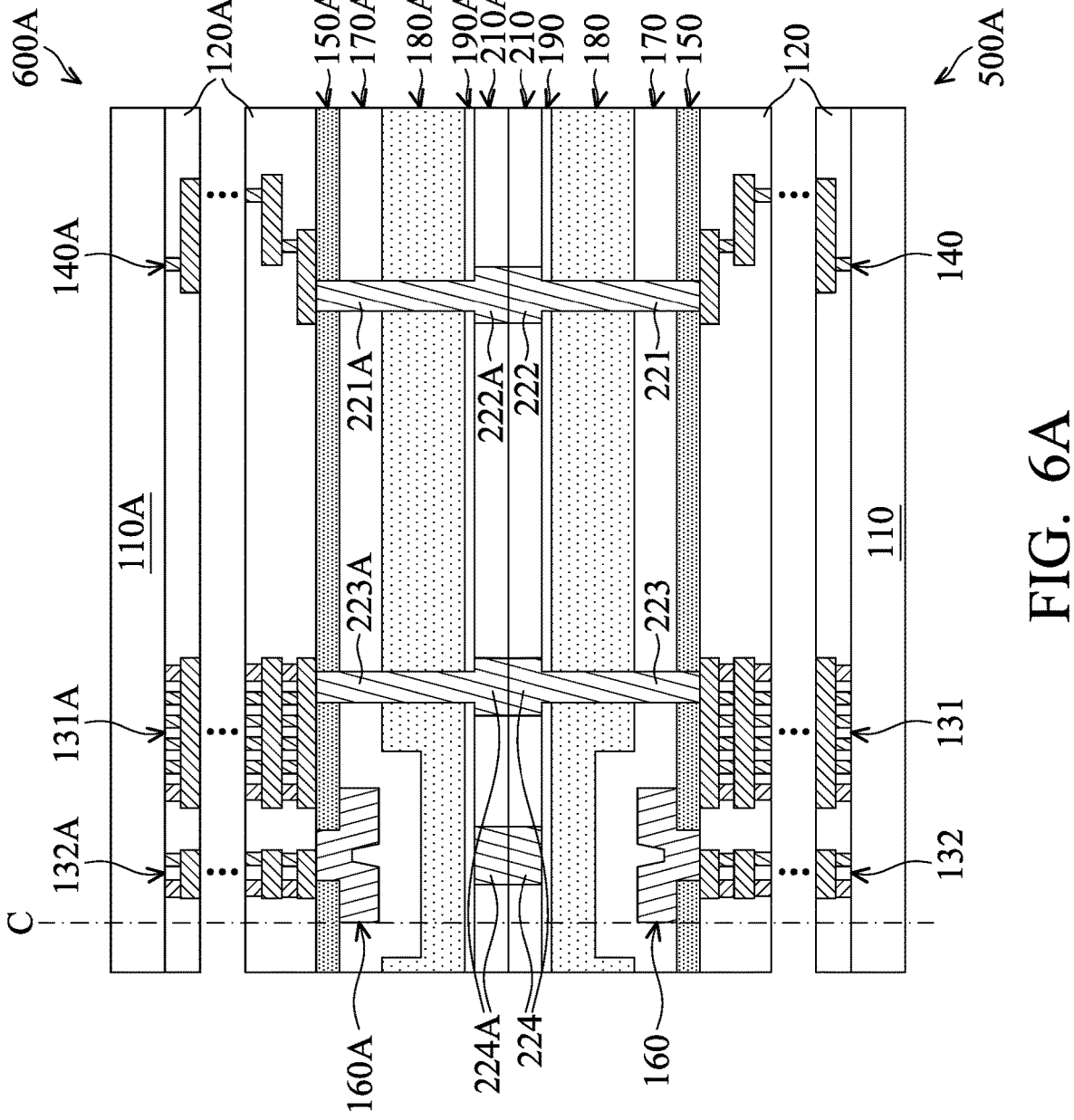
FIGS. 6A-6B are cross-sectional views of various stages of a process for forming a semiconductor device structure, in accordance with some embodiments.
Figure 6B:
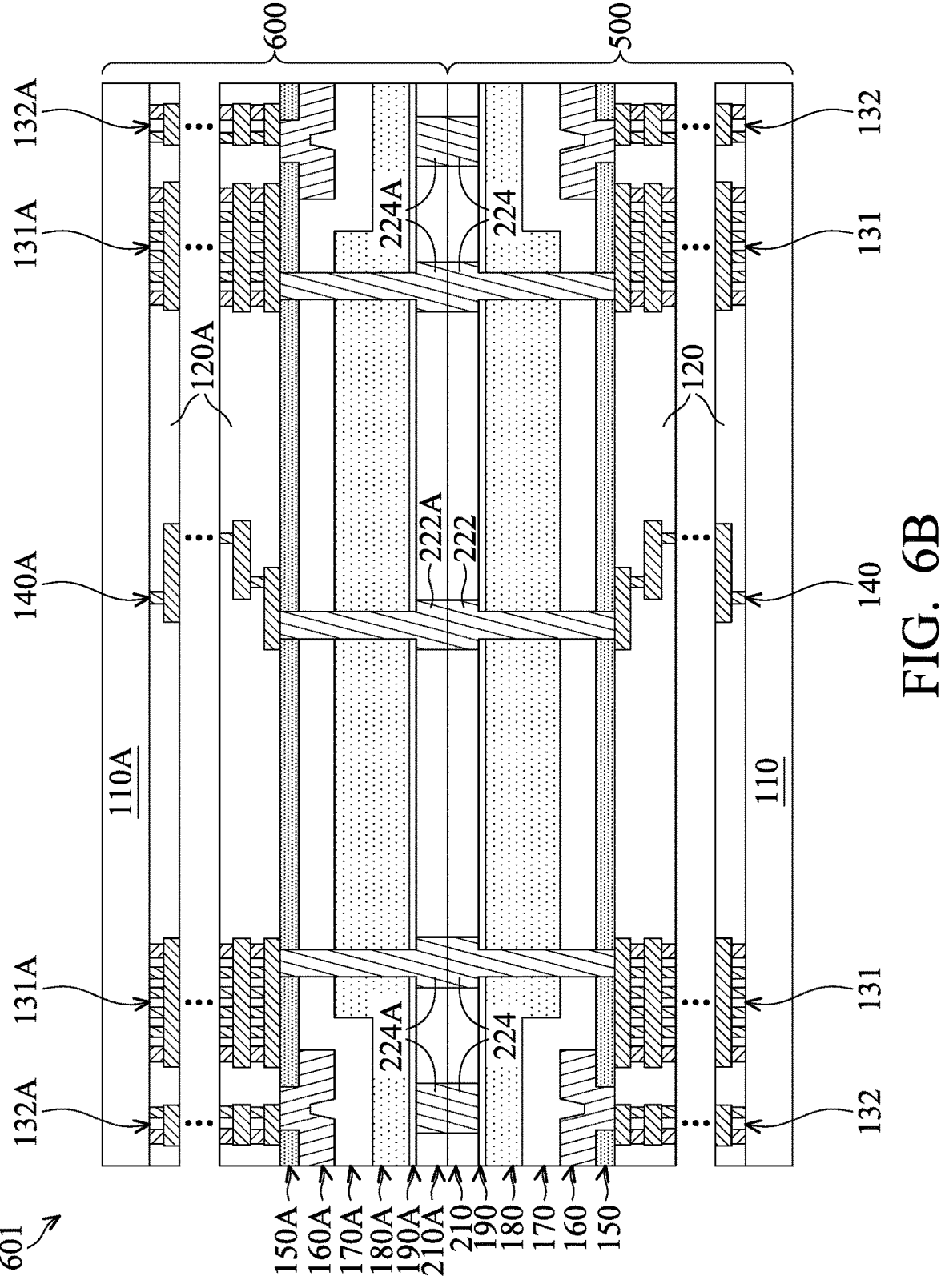

FIGS. 6A-6B are cross-sectional views of various stages of a process for forming a semiconductor device structure, in accordance with some embodiments. As shown in FIG. 6A, after the step of FIG. 5C, a semiconductor structure 600A is bonded to the semiconductor structure 500A of FIG. 5C, in accordance with some embodiments.

The semiconductor structure 600A may be similar to the semiconductor structure 500A of FIG. 5C. The semiconductor structure 600A optionally includes a substrate 110A, a dielectric structure 120A, seal ring structures 131A and 132A, a wiring structure 140A, a passivation layer 150A, a pad layer 160A, a passivation layer 170A, a planarization layer 180A, an etch stop layer 190A, a bonding film 210A, conductive plugs 221A and 223A, and bonding pads 222A and 224A, in accordance with some embodiments.

In the semiconductor structures 500A and 600A, elements designated by similar reference numbers have structures and materials that are the same or similar, in accordance with some embodiments. In some embodiments, the layout of the wiring structure 140A is different from the layout of the wiring structure 140.

The bonding pads 222A of the semiconductor structure 600A are directly bonded to the bonding pads 222 of the semiconductor structure 500A, in accordance with some embodiments. The bonding pads 224A of the semiconductor structure 600A are directly bonded to the bonding pads 224 of the semiconductor structure 500A, in accordance with some embodiments.

The bonding film 210A of the semiconductor structure 600A is directly bonded to the bonding film 210 of the semiconductor structure 500A, in accordance with some embodiments. The temperature of the bonding process ranges from about 200° C. to about 400° C., in accordance with some embodiments.

As shown in FIGS. 6A and 6B, a dicing process is performed over the semiconductor structures 500A and 600A, in accordance with some embodiments. The dicing process cuts through the semiconductor structures 500A and 600A so as to form individual semiconductor device structures 601, in accordance with some embodiments.

FIG. 6B only shows one of the semiconductor device structures 601, in accordance with some embodiments. Each semiconductor device structure 601 includes a chip structure 500 and a chip structure 600, in accordance with some embodiments. The chip structure 500 is cut from the semiconductor structure 500A, in accordance with some embodiments.

The chip structure 600 is cut from the semiconductor structure 600A, in accordance with some embodiments. The chip structures 100, 200, 300, 400, 500, and 600 are also referred to as semiconductor device structures, in accordance with some embodiments.

Processes and materials for forming the chip structures 200, 300, 400, 500, and 600 may be similar to, or the same as, those for forming the chip structure 100 described above. Processes and materials for forming the semiconductor device structures 401 and 601 may be similar to, or the same as, those for forming the semiconductor device structure 201 described above.

Elements designated by the same reference numbers as those in FIGS. 1A to 6B have structures and materials that are the same or similar. Therefore, the detailed descriptions thereof will not be repeated herein.

In accordance with some embodiments, semiconductor device structures and methods for forming the same are provided. The methods (for forming the semiconductor device structure) form additional bonding pads over a seal ring region of a substrate. Therefore, the number of the bonding pads is greatly increased. As a result, the bondability of the chip structure is improved. The reliability of the semiconductor device structure with two of the chip structures, which are bonded with each other through the bonding pads, is improved.

In accordance with some embodiments, a semiconductor device structure is provided. The semiconductor device structure includes a substrate having a device region and a seal ring region surrounding the device region. The semiconductor device structure includes a seal ring structure over the seal ring region. The seal ring structure surrounds the device region. The semiconductor device structure includes a bonding film over the seal ring structure and the substrate. The semiconductor device structure includes a bonding pad embedded in the bonding film. The bonding pad overlaps the seal ring structure along an axis perpendicular to a first top surface of the substrate, and a second top surface of the bonding pad is substantially level with a third top surface of the bonding film.

In accordance with some embodiments, a semiconductor device structure is provided. The semiconductor device structure includes a substrate having a device region and a seal ring region surrounding the device region. The semiconductor device structure includes a seal ring structure over the seal ring region. The seal ring structure surrounds the device region. The semiconductor device structure includes a first bonding film over the substrate and the seal ring structure. The semiconductor device structure includes a first bonding pad embedded in the first bonding film. The first bonding pad and the first bonding film have a same thickness. The semiconductor device structure includes a conductive plug between and in contact with the first bonding pad and the seal ring structure.

In accordance with some embodiments, a method for forming a semiconductor device structure is provided. The method includes providing a substrate. The substrate has a device region and a seal ring region surrounding the device region. The method includes forming a seal ring structure over the seal ring region. The seal ring structure surrounds the device region. The method includes forming a first bonding film over the seal ring structure and the substrate. The method includes partially removing the first bonding film to form an opening in the first bonding film. The method includes forming a first bonding pad in the opening. The first bonding pad overlaps the seal ring structure along an axis perpendicular to a first top surface of the substrate, and a second top surface of the first bonding pad is substantially level with a third top surface of the first bonding film.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate having a device region and a seal ring region surrounding the device region;
    a seal ring structure over the seal ring region, wherein the seal ring structure surrounds the device region;
    a bonding film over the seal ring structure and the substrate;
    a bonding pad embedded in the bonding film, wherein the bonding pad overlaps the seal ring structure along an axis perpendicular to a first top surface of the substrate, and a second top surface of the bonding pad is substantially level with a third top surface of the bonding film;
    a pad over and connected to the seal ring structure, wherein the bonding pad overlaps the pad; and
    a conductive plug connected between the pad and the bonding pad.

2. The semiconductor device structure as claimed in claim 1, further comprising:
    a dielectric structure over the substrate, wherein the seal ring structure is in the dielectric structure, and the bonding film is over the dielectric structure.

3. The semiconductor device structure as claimed in claim 2, wherein the seal ring structure comprises a ring strip structure surrounding the device region, and a fourth top surface of the ring strip structure is substantially level with a fifth top surface of the dielectric structure.

4. The semiconductor device structure as claimed in claim 3, wherein the bonding pad overlaps the ring strip structure.

5. The semiconductor device structure as claimed in claim 3, wherein the seal ring structure further comprises a ring wall structure under the ring strip structure, the ring wall structure continuously surrounds the device region, and a first line width of the ring wall structure is less than a second line width of the ring strip structure.

6. The semiconductor device structure as claimed in claim 5, wherein the bonding pad overlaps the ring wall structure.

7. The semiconductor device structure as claimed in claim 5, wherein the seal ring structure further comprises a pillar under the ring strip structure, the pillar is narrower than the ring wall structure, and the bonding pad overlaps the pillar.

8. A semiconductor device structure, comprising:
    a substrate having a device region and a seal ring region surrounding the device region;
    a seal ring structure over the seal ring region, wherein the seal ring structure surrounds the device region;
    a first bonding film over the substrate and the seal ring structure;
    a first bonding pad embedded in the first bonding film, wherein the first bonding pad and the first bonding film have a same thickness;

a conductive plug between the first bonding pad and the seal ring structure; and a pad connected between the seal ring structure and the conductive plug.

9. The semiconductor device structure as claimed in claim 8, wherein a first top surface of the first bonding pad and a second top surface of the first bonding film are substantially coplanar with each other.

10. The semiconductor device structure as claimed in claim 8, further comprising:

a chip structure over the substrate, wherein the chip structure comprises a second bonding pad, wherein the second bonding pad is directly bonded to the first bonding pad.

11. The semiconductor device structure as claimed in claim 10, wherein the chip structure further comprises a second bonding film, the second bonding pad is embedded in the second bonding film, and the second bonding film is directly bonded to the first bonding film.

12. A method for forming a semiconductor device structure, comprising:

providing a substrate, wherein the substrate has a device region and a seal ring region surrounding the device region;

forming a seal ring structure over the seal ring region, wherein the seal ring structure surrounds the device region;

forming a first bonding film over the seal ring structure and the substrate;

partially removing the first bonding film to form an opening in the first bonding film;

forming a first bonding pad in the opening, wherein the first bonding pad overlaps the seal ring structure along an axis perpendicular to a first top surface of the substrate, and a second top surface of the first bonding pad is substantially level with a third top surface of the first bonding film;

forming a pad over the seal ring structure before forming the first bonding film over the seal ring structure and the substrate, wherein the pad is in direct contact with the seal ring structure; and forming a conductive plug on the pad before forming the first bonding film over the seal ring structure and the substrate, wherein the first bonding pad is formed over and in direct contact with the conductive plug.

13. The method for forming the semiconductor device structure as claimed in claim 12, further comprising:

bonding a semiconductor structure to the substrate, wherein the semiconductor structure comprises a second bonding pad, and the second bonding pad is directly bonded to the first bonding pad.

14. The method for forming the semiconductor device structure as claimed in claim 13, wherein the semiconductor structure comprises a second bonding film, and the second bonding film is directly bonded to the first bonding film.

15. The method for forming the semiconductor device structure as claimed in claim 12, wherein the seal ring structure comprises a pillar, and the first bonding pad overlaps the pillar.

16. The semiconductor device structure as claimed in claim 1, wherein the conductive plug is laterally spaced apart from the seal ring structure.

17. The semiconductor device structure as claimed in claim 1, wherein a bottom of the bonding pad is wider than a top of the conductive plug.

18. The semiconductor device structure as claimed in claim 8, wherein the conductive plug is laterally spaced apart from an interface between the seal ring structure and the pad.

19. The semiconductor device structure as claimed in claim 18, wherein the pad extends from the interface between the seal ring structure and the pad to beyond an edge of the seal ring structure.

20. The method for forming the semiconductor device structure as claimed in claim 12, wherein the conductive plug is laterally spaced apart from the seal ring structure.

* * * * *